(12) United States Patent
Wang et al.

(10) Patent No.: US 12,101,087 B2
(45) Date of Patent: Sep. 24, 2024

(54) BISTABLE PHYSICAL UNCLONABLE FUNCTION CIRCUIT BASED ON SUBTHRESHOLD LEAKAGE CURRENT DEVIATION

(71) Applicant: Wenzhou University, Zhejiang (CN)

(72) Inventors: Pengjun Wang, Zhejiang (CN); Yuanfeng Xie, Zhejiang (CN); Gang Li, Zhejiang (CN); Hao Ye, Zhejiang (CN)

(73) Assignee: Wenzhou University, Zhejiang (CN)

( * ) Notice: Subject to any disclaimer, the term of this patent is extended or adjusted under 35 U.S.C. 154(b) by 160 days.

(21) Appl. No.: 18/087,834

(22) Filed: Dec. 23, 2022

(65) Prior Publication Data
US 2024/0137019 A1   Apr. 25, 2024

(30) Foreign Application Priority Data
Oct. 13, 2022  (CN) .......................... 202211253407.6

(51) Int. Cl.
*H03K 19/003*  (2006.01)
*H03K 19/20*  (2006.01)

(52) U.S. Cl.
CPC ....... *H03K 19/00315* (2013.01); *H03K 19/20* (2013.01)

(58) Field of Classification Search
None
See application file for complete search history.

(56) References Cited

U.S. PATENT DOCUMENTS

| | | | |
|---|---|---|---|
| 10,432,198 B1* | 10/2019 | Wang | G06F 1/10 |
| 2020/0014547 A1* | 1/2020 | Lu | G11C 11/417 |
| 2021/0036872 A1* | 2/2021 | Abeln | G11C 7/24 |

OTHER PUBLICATIONS

Kunyang Liu et al., "A 0.5-V Hybrid SRAM Physically Unclonable Function Using Hot Carrier Injection Burn-In for Stability Reinforcement," IEEE Journal of Solid-State Circuits, vol. 56, Jul. 2021, pp. 2193-2204.

(Continued)

*Primary Examiner* — Anh Q Tran
(74) *Attorney, Agent, or Firm* — JCIPRNET

(57) ABSTRACT

A bistable physical unclonable function circuit based on subthreshold leakage current deviation comprises a time sequence control circuit, a decoder, 16 bias voltage converters and a PUF array, wherein the time sequence control circuit is used for generating a precharge signal and an enable signal, the decoder is used for converting an external stimulus signal into 16 decoded signals under the control of the precharge signal and the enable signal, the $k^{th}$ bias voltage converter is used for converting the $k^{th}$ decoded signal into a $k^{th}$ word line signal which is input to the PUF array, the PUF array is used for generating 16 response signals under the control of the precharge signal and the 16 word line signals, and comprises four PMOS transistors, four NMOS transistors, two two-input NAND gates and sixteen PUF units, and each PUF unit comprises two NMOS transistors.

4 Claims, 7 Drawing Sheets

(56) References Cited

OTHER PUBLICATIONS

Gang Li et al., "A 215-$F^2$ Bistable Physically Unclonable Function With an ACF of <0.005 and a Native Bit Instability of 2.05% in 65-nm CMOS Process," IEEE Transactions on Very Large Scale Integration (VLSI) Systems, vol. 28, Nov. 2020, pp. 2290-2299.
Kaiyuan Yang et al., "8.3 A 553F2 2-transistor amplifier-based Physically Unclonable Function (PUF) with 1.67% native instability," 2017 IEEE International Solid-State Circuits Conference(ISSCC), Feb. 2017, pp. 1-3.
Qiang Zhao et al., "A 1036-F2/Bit High Reliability Temperature Compensated Cross-Coupled Comparator-Based PUF," IEEE Transactions on Very Large Scale Integration (VLSI) Systems, vol. 28, Jun. 2020, pp. 1449-1460.
Yizhak Shifman et al., "An SRAM-Based PUF With a Capacitive Digital Preselection for a 1E-9 Key Error Probability," IEEE Transactions on Circuits and Systems—I: Regular Papers, vol. 67, Dec. 2020, pp. 4855-4868.
Sachin Taneja et al., "Fully Synthesizable PUF Featuring Hysteresis and Temperature Compensation for 3.2% Native BER and 1.02 fJ/b in 40 nm," IEEE Journal of Solid-State Circuits, vol. 53, Oct. 2018, pp. 2828-2839.
Jiangyi Li et al., "Ultra-Compact and Robust Physically Unclonable Function Based on Voltage-Compensated Proportional-to-Absolute-Temperature Voltage Generators," IEEE Journal of Solid-State Circuits, vol. 51, Sep. 2016, pp. 2192-2202.

\* cited by examiner

BISTABLE PHYSICAL UNCLONABLE FUNCTION CIRCUIT BASED ON SUBTHRESHOLD LEAKAGE CURRENT DEVIATION

CROSS-REFERENCE TO RELATED APPLICATION

This application claims the priority benefit of China application serial no. 202211253407.6, filed on Oct. 13, 2022. The entirety of the above-mentioned patent application is hereby incorporated by reference herein and made a part of this specification.

BACKGROUND

Technical Field

The invention relates to a bistable physical unclonable function circuit, in particular to a bistable physical unclonable function circuit based on subthreshold leakage current deviation.

Description of Related Art

The bistable physical unclonable function (PUF) circuit, as a PUF circuit with a cross-coupled circuit structure as the core, is always in a stable state when not triggered by an external stimulus signal, and will switch from the current stable state to another stable state when triggered by an external stimulus signal. The cross-coupled structure, as the basic unit of the bistable circuit, has the feedfoward characteristic which is beneficial to rapid calculation and data storage, and can be applied to flip-latches, flip-flops, SRAMs, and the like.

The SRAM PUF circuit, as one of the most typical bistable PUF circuits, extracts hardware fingerprints by means of random process deviation of the cross-coupled circuit. Traditional bistable PUF circuit design schemes often use six or more transistors as switch tubes and deviation entropy source tubes, thus having large area and power expenditures. In Literature Shifman Y, Miller A, Keren O, et al., *An SRAM-Based PUF With a Capacitive Digital Preselection for a 1E-9 Key Error Probability* [J]. *Circuits and Systems I: Regular Papers, IEEE Transactions on,* 2020, pp(99):1-14. doi: 10.1109 TCSL2020.2996772., Shifman et al., adopted a "capacitor-preferred" preselection mechanism for instable units in a bistable PUF, and added a controllable capacitor to any one cross-coupled inverter node to decrease the error rate to $10^{-9}$, but the layout area of the PUF is as large as $3001F^2$. In Literature G. Li, P. Wang, X Ma, et al., *A 215-$F^2$ Bistable Physically Unclonable Function With an ACF of <0.005 and a Native Bit Instability of 2.05% in 65-nm CMOS Process*[J]. *IEEE Transactions on Very Large Scale Integration (VLSI) Systems,* 2020, 28:2290-2299. doi: 10.1109 TVLSL2020.3014892., Li et al., put forward, based on a bistable PUF unit sharing and random reading strategy, a lightweight bistable weak PUF, of which the unit feature size is merely $215F^2$, but the error rate is 2.21%. In literature Q. Zhao, Y. Wu, X Zhao, et al., *A 1036-F2 Bit High Reliability Temperature Compensated Cross-Coupled Comparator-Based PUF*[J], *IEEE Transactions on Very Large Scale Integration (VLSI) Systems,* vol. 28, no. 6, pp. 1449-1460, June 2020, doi: 10.1109 TVLSL2020.2980306., Zhao, et al. put forward a design scheme of a cross-coupled comparator-based PUF circuit, which uses CTAT and SMV to decrease the error rate, but the unit layout area is as high as $1036F^2$.

All these PUF circuit design schemes are either have a large area expenditure in spite of their low error rate and high stability, or have a high error rate and poor stability in spite of their small area expenditure, and thus, none of them takes into account both the error rate and the area expenditure.

SUMMARY

The technical issue to be settled by the invention is to provide a bistable physical unclonable function circuit based on subthreshold leakage current deviation, which has a low error rate and a small area expenditure and takes into account both the error rate and the area expenditure.

The technical solution adopted by the invention to settle the above technical issue is as follows: a bistable physical unclonable function circuit based on subthreshold leakage current deviation comprises a time sequence control circuit, a decoder, 16 bias voltage converters and a PUF array, wherein the time sequence control circuit is controlled by an external clock signal CLK to generate and output a precharge signal PRE and an enable signal AEN; the precharge signal PRE and the enable signal AEN are input to the decoder, the decoder is controlled by the precharge signal PRE and the enable signal AEN to convert an external stimulus signal ADDR<0:3> into 16 decoded signals and output the decoded signals, the external stimulus signal ADDR<0:3> is a four-bit binary number, a first bit of the external stimulus signal ADDR<0:3> is ADDR<0>, a second bit of the external stimulus signal ADDR<0:3> is ADDR<1>, a third bit of the external stimulus signal ADDR<0:3> is ADDR<2>, and a fourth bit of the external stimulus signal ADDR<0:3> is ADDR<3>; the $k^{th}$ decoded signal is input to the $k^{th}$ bias voltage converter and is converted by the $k^{th}$ bias voltage converter into a $k^{th}$ word line signal WL<k> which is input to the PUF array, wherein k=1, 2, . . . , 16; the PUF array is controlled by the precharge signal PRE and the word line signals output by the 16 bias voltage converters to generate response signals and output the response signals in series; the PUF array comprises a first PMOS transistor, a second PMOS transistor, a third PMOS transistor, a fourth PMOS transistor, a first NMOS transistor, a second NMOS transistor, a third NMOS transistor, a fourth NMOS transistor, a first two-input NAND gate, a second two-input NAND gate and 16 PUF units; each PUF unit has a first input terminal, a second input terminal, a first output terminal, a second output terminal and a control terminal, the first two-input NAND gate and second two-input NAND gate each have a first input terminal, a second input terminal and an output terminal, and a width-to-length ratio WP/LP of the first PMOS transistor and the second PMOS transistor is 2 µm/60 nm; an external supply voltage VDD is accessed to a source of the first PMOS transistor and a source of the second PMOS transistor, and the value of VDD is 1.0V-1.4V; a gate of the first PMOS transistor and a gate of the second PMOS transistor are connected, a connecting terminal is a control terminal of the PUF array, and the precharge signal PRE is input to the control terminal of the PUF array; a drain of the first PMOS transistor is connected to a source of the third PMOS transistor; a drain of the second PMOS transistor is connected to a source of the fourth PMOS transistor; a gate of the third PMOS transistor, a drain of the fourth PMOS transistor and a gate of the first NMOS transistor are connected to the second input terminal of the first PUF unit; a gate of the fourth PMOS transistor, a drain of the third PMOS transistor and a gate of the second NMOS transistor are connected to the first input terminal of the first PUF unit; the first output terminal of the $j^{th}$ PUF unit is connected to the first input terminal of the $(j+1)^{th}$ PUF unit, the second output terminal of the $j^{th}$ PUF unit is connected to the second input terminal of the $(j+1)^{th}$ PUF unit, and $j=1$, 2, ..., 15; the first output terminal of the sixteenth PUF unit is connected to a drain of the first NMOS transistor, and a second output terminal of the sixteenth PUF unit is connected to a drain of the second NMOS transistor; the control terminal of the $k^{th}$ PUF unit is taken as a $k^{th}$ control terminal of the PUF array, and the word line signal WL<k> output by the $k^{th}$ bias voltage converter is input to the $k^{th}$ control terminal of the PUF array; a source of the first NMOS transistor is connected to a drain of the third NMOS transistor; a source of the second NMOS transistor is connected to a drain of the fourth NMOS transistor; a gate of the third NMOS transistor is connected to a gate of the fourth NMOS transistor; a source of the third NMOS transistor is connected to the first input terminal of the first two-input NAND gate; a source of the fourth NMOS transistor is connected to the first input terminal of the second two-input NAND gate; the second input terminal of the first two-input NAND gate is connected to the output terminal of the second two-input NAND gate; the second input terminal of the second two-input NAND gate is connected to the output terminal of the first two-input NAND gate, and a connecting terminal is taken as an output terminal of the PUF array and is used for outputting the response signals; each bias voltage converter comprises a twelfth PMOS transistor and a fourteenth NMOS transistor, wherein a gate of the twelfth PMOS transistor and a gate of the fourteenth NMOS transistor are connected, a connecting terminal is taken as an input terminal of the bias voltage converter, to which one decoded signal output by the decoder is input; a drain of the twelfth PMOS transistor and a drain of the fourteenth NMOS transistor are connected, and a connecting terminal is taken as an output terminal of the bias voltage converter, which is used for outputting the word line signal; the external supply voltage VDD is input to a source of the twelfth PMOS transistor; an external bias voltage VBB is input to a source of the fourteenth NMOS transistor, and the value of VBB is 300 mV-425 mV; under the control of the decoded signal input to the input terminal of the bias voltage converter, the output terminal of the bias voltage converter outputs the voltage VDD or the bias voltage VBB; when the decoded signal input to the input terminal of the bias voltage converter is a high level, the twelfth PMOS transistor is turned off, the fourteenth NMOS is turned on, and the output terminal of the bias voltage converter outputs the bias voltage VBB; when the decoded signal input to the input terminal of the bias voltage converter is a low level, the twelfth PMOS transistor is turned on, the fourteenth NMOS is turned off, and the output terminal of the bias voltage converter outputs the voltage VDD; each PUF unit comprises a fifth NMOS transistor and a sixth NMOS transistor, wherein a drain of the fifth NMOS transistor is taken as the first input terminal of the PUF unit, a source of the fifth NMOS transistor is taken as the first output terminal of the PUF unit, a source of the sixth NMOS transistor is taken as the second output terminal of the PUF unit, a gate of the fifth NMOS transistor and a gate of the sixth NMOS transistor are connected, and a connecting terminal is taken as the control terminal of the PUF unit; the first PMOS transistor and the second PMOS transistor form a P-type sharing terminal used for isolating the 16 PUF units from the external supply voltage VDD; the third PMOS transistor, the fourth PMOS transistor, the first NMOS transistor and the second NMOS transistor form a cross-coupled bistable structure; in each PUF unit, the fifth NMOS transistor and the sixth NMOS transistor are taken as gating switch tubes, a current across the fifth NMOS transistor is denoted as I1, a current across the sixth NMOS transistor is denoted as I2, and I1 and I2 are used as bias current sources; when the bistable physical unclonable function circuit works, the external clock signal CLK is input to the time sequence control circuit, which in turn generates and outputs the precharge signal PRE and the enable signal AEN; after receiving the precharge signal PRE and the enable signal AEN, the decoder decodes the external stimulus signal ADDR<0:3> to generate and output 16 decoded signals, the 16 bias voltage converters process the 16 decoded signals correspondingly to obtain and output corresponding word line signals, and the word line signal output by each bias voltage converter is either the voltage VDD or the bias voltage VBB; when the word line signal output by one bias voltage converter is the bias voltage VBB, the fifth NMOS transistor and the sixth NMOS transistor in the PUF unit connected to said bias voltage converter work in a subthreshold region; 16 word line signals are correspondingly input to the 16 PUF units, the working state of each PUF unit is divided into a precharge phase and an evaluation phase, and under the control of the precharge signal PRE and the 16 word line signals, the 16 PUF units enter the working state sequentially from the first PUF unit to the sixteenth PUF unit; first, a decoded signal WL<0>, which is VBB, is input to the first PUF unit, decoded signals, which are all VDD, are input the other fifteen PUF units which are completely turned on, the precharge signal PRE is a low level, the first PUF unit enters the precharge phase, a connection node of the gate of the second NMOS transistor, the drain of the third PMOS transistor, the gate of the fourth PMOS transistor and the first output terminal of the first PUF unit is denoted as Q, a connection node of the gate of the third PMOS transistor, the drain of the fourth PMOS transistor, the gate of the first NMOS transistor and the second output terminal of the first PUF unit is denoted as QB, Q and QB are charged to the voltage VDD, then the precharge signal PRE turns into a high level, the first PUF unit enters the evaluation phase, Q and QB start to discharge through the first PUF unit, and because of the current deviation between the current I1 across the fifth NMOS transistor and the current I2 across the sixth NMOS transistor in the first PUF unit, the P-type sharing terminal and the cross-coupled bistable structure, the voltage of the fifth NMOS transistor and the sixth NMOS transistor in the first PUF unit is quickly amplified, and a stable output response is established quickly; if I1>I2, the voltage at QB is VQB=VDD, and the voltage at Q is VQ=0; if I1<I2, the voltage at QB is VQB=0, and the voltage at Q is VQ=VDD; at this moment, an RS flip-latch formed by the first two-output NAND gate and the second two-output NAND gate outputs a first response signal, and the bistable physical unclonable function circuit completes the output of the first response signal; next, a decoded signal WL<1>, which is VBB, is input to the second PUF unit, decoded signals, which are all VDD, are input to the other fifteen PUF units which are completely turned on, the precharge signal PRE is a low level, the second PUF unit enters the precharge phase and works in a same way as the first PUF unit until the bistable physical unclonable function circuit outputs a second response signal; this process is repeated unit the sixteenth PUF finishes working, and at this moment, one work cycle of the PUF array is completed; and then, a next work cycle is started under the control of the precharge signal PRE, and this process is repeated until the bistable physical unclonable function circuit stops working.

The time sequence control circuit comprises a fifth PMOS transistor, a sixth PMOS transistor, a seventh PMOS transistor, an eighth PMOS transistor, a ninth PMOS transistor, a seventh NMOS transistor, an eighth NMOS transistor, a ninth NMOS transistor, a tenth NMOS transistor, an eleventh NMOS transistor, a first two-input AND gate, a first inverter, a second inverter, a third two-input NAND gate and 25 buffers, wherein the first two-input AND gate and the third two-input NAND gate each have a first input terminal, a second input terminal and an output terminal; the external supply voltage VDD is accessed to the source of the first PMOS transistor, a source of the seventh PMOS transistor and a source of the eighth PMOS transistor; a gate of the fifth PMOS transistor is connected to a gate of the eighth NMOS transistor; a drain of the fifth PMOS transistor is connected to a source of the sixth PMOS transistor; a drain of the sixth PMOS transistor, a drain of the seventh NMOS transistor, a gate of the seventh PMOS transistor, a gate of the ninth NMOS transistor, a drain of the ninth PMOS transistor and a drain of the tenth NMOS transistor are connected; a source of the seventh NMOS transistor is connected to a drain of the eighth NMOS transistor; a source of the eighth NMOS transistor is grounded; a gate of the sixth PMOS transistor and a gate of the tenth NMOS transistor are connected to the first input terminal of the first two-input AND gate, and a connecting terminal is a clock terminal of the time sequence control circuit, and the external clock signal CLK is input to the clock terminal of the time sequence control circuit; a gate of the seventh NMOS transistor is connected to a gate of the ninth PMOS transistor; a gate of the seventh PMOS transistor, a drain of the ninth NMOS transistor, a gate of the eighth PMOS transistor and a gate of the eleventh NMOS transistor are connected to the second input terminal of the first two-input AND gate; a source of the ninth NMOS transistor and a source of the eleventh NMOS transistor are grounded; a drain of the eighth PMOS transistor is connected to a source of the ninth PMOS transistor; a source of the tenth NMOS transistor is connected to a drain of the eleventh NMOS transistor; the output terminal of the first two-input AND gate, an output terminal of the first buffer and the first input terminal of the third two-input NAND gate are connected, a connecting terminal is an enable output terminal of the time sequence control circuit, and the enable output terminal of the time sequence control circuit is used for outputting the enable signal AEN; an output terminal of the $m^{th}$ buffer is connected to an input terminal of the $(m+1)^{th}$ buffer, and m=1, 2, ..., 24; an output terminal of the twenty-fifth buffer is connected to an input terminal of the first inverter, an output terminal of the first inverter is connected to the second input terminal of the third two-input NAND gate, the output terminal of the third two-input NAND gate is connected to an input terminal of the second inverter, an output terminal of the second inverter is a control output terminal of the time sequence control circuit, and the control output terminal of the time sequence control circuit is used for outputting the precharge signal PRE. In the time sequence control circuit, the external clock signal CLK enhances the drive capacity through the first two-input AND gate, and the 25 buffers not only control the delay of the external clock signal CLK, but also control the duty cycle of the external clock signal CLK together with the first inverter, the second inverter and the third two-input NAND gate, such that the desired precharge signal PRE is generated; a signal obtained after the external clock signal CLK is filtered by a pre-circuit (formed by the fifth PMOS transistor, the sixth PMOS transistor, the seventh PMOS transistor, the eighth PMOS transistor, the ninth PMOS transistor, the seventh NMOS transistor, the eighth NMOS transistor, the ninth NMOS transistor, the tenth NMOS transistor and the eleventh NMOS transistor) is subjected to a logic AND operation in the first two-input AND gate to generate the enable signal AEN, such that the noise immunity of the enable signal AEN is improved, and the stability of the time sequence control circuit is guaranteed.

Each buffer comprises a tenth PMOS transistor, an eleventh PMOS transistor, a twelfth NMOS transistor and a thirteenth NMOS transistor, wherein the external supply voltage VDD is accessed to a source of the tenth PMOS transistor and a source of the eleventh PMOS transistor; a gate of the tenth PMOS transistor and a gate of the twelfth NMOS transistor are connected, and a connecting terminal is an input terminal of the buffer; a drain of the tenth PMOS transistor, a drain of the twelfth NMOS transistor, a gate of the eleventh PMOS transistor and a gate of the thirteenth NMOS transistor are connected; a drain of the eleventh PMOS transistor and a drain of the thirteenth NMOS transistor are connected, and a connecting terminal is an output terminal of the buffer; and a source of the twelfth NMOS transistor and a source of the thirteenth NMOS transistor are grounded.

The decoder comprises a first flip-latch, a second flip-latch, a third flip-latch, a fourth flip-latch, a second two-input AND gate, a third two-input AND gate, a fourth two-input AND gate, a fifth two-input AND gate, a sixth two-input AND gate, a seventh two-input AND gate, an eighth two-input AND gate, a ninth two-input AND gate and 16 stages of three-input AND gate, wherein the first flip-latch, the second flip-latch, the third flip-latch and the fourth flip-latch each have an input terminal, an enable terminal, an output terminal and an inverse output terminal; the second two-input AND gate, the third two-input AND gate, the fourth two-input AND gate, the fifth two-input AND gate, the sixth two-input AND gate, the seventh two-input AND gate, the eighth two-input AND gate and the ninth two-input AND gate each have a first input terminal, a second input terminal and an output terminal; and each stage of three-input AND gate has a first input terminal, a second input terminal, a third input terminal and an output terminal; the enable terminal of the first flip-latch, the enable terminal of the second flip-latch, the enable terminal of the third flip-latch and the enable terminal of the fourth flip-latch are connected, a connecting terminal is an enable terminal of the decoder, and the enable signal AEN is input to the enable terminal of the decoder; ADDR<0> is input to the input terminal of the first flip-latch, ADDR<1> is input to the input terminal of the second flip-latch, ADDR<2> is input to the input terminal of the third flip-latch, ADDR<3> is input to the input terminal of the fourth flip-latch, the output terminal of the first flip-latch outputs a first latch signal AD<0>, the inverse output terminal of the first flip-latch outputs a first inverse signal ADB<0>, the output terminal of the second flip-latch outputs a second latch signal AD<1>, the inverse output terminal of the second flip-latch outputs a second inverse signal ADB<1>, the output terminal of the third flip-latch outputs a third latch signal AD<2>, the inverse output terminal of the third flip-latch outputs a third inverse signal ADB<2>, the output terminal of the fourth flip-latch outputs a fourth latch signal AD<3>, and the inverse output terminal of the fourth flip-latch outputs a fourth inverse signal ADB<3>; the output terminal of the first flip-latch is connected to the first input terminal of the second two-input AND gate and the first input terminal of the fourth two-input AND gate, the reverse output terminal of the first flip-latch is to the second input terminal of the third two-input AND gate and the first input terminal of the fifth two-input AND gate, the output terminal of the second flip-latch is connected to the second input terminal of the second two-input AND gate and the first input terminal of the third two-input AND gate, the reverse output terminal of the second flip-latch is to the second input terminal of the fourth two-input AND gate and the second input terminal of the fifth two-input AND gate, the output terminal of the third flip-latch is connected to the first input terminal of the sixth two-input AND gate and the first input terminal of the eighth two-input AND gate, the reverse output terminal of the third flip-latch is to the second input terminal of the seventh two-input AND gate and the first input terminal of the ninth two-input AND gate, the output terminal of the fourth flip-latch is connected to the second input terminal of the sixth two-input AND gate and the first input terminal of the seventh two-input AND gate, the reverse output terminal of the fourth flip-latch is to the second input terminal of the eighth two-input AND gate and the second input terminal of the ninth two-input AND gate, the output terminal of the second two-input AND gate is connected to the first input terminal of the first stage of three-input AND gate, the first input terminal of the second stage of three-input AND gate, the first input terminal of the third stage of three-input AND gate and the first input terminal of the fourth stage of three-input AND gate, the output terminal of the second two-input AND gate outputs binary data X<0>, the output terminal of the third two-input AND gate is connected to the first input terminal of the fifth stage of three-input AND gate, the first input terminal of the sixth stage of three-input AND gate, the first input terminal of the seventh stage of three-input AND gate and the first input terminal of the eighth stage of three-input AND gate, the output terminal of the third two-input AND gate outputs binary data X<1>, the output terminal of the fourth two-input AND gate is connected to the first input terminal of the ninth stage of three-input AND gate, the first input terminal of the tenth stage of three-input AND gate, the first input terminal of the eleventh stage of three-input AND gate and the first input terminal of the twelfth stage of three-input AND gate, the output terminal of the fourth two-input AND gate outputs binary data X<2>, the output terminal of the fifth two-input AND gate is connected to the first input terminal of the thirteenth stage of three-input AND gate, the first input terminal of the fourteenth stage of three-input AND gate, the first input terminal of the fifteenth stage of three-input AND gate and the first input terminal of the sixteenth stage of three-input AND gate, the output terminal of the fifth two-input AND gate outputs binary data X<3>, the output terminal of the sixth two-input AND gate is connected to the second input terminal of the first stage of three-input AND gate, the second input terminal of the fifth stage of three-input AND gate, the second input terminal of the ninth stage of three-input AND gate and the second input terminal of the thirteenth stage of three-input AND gate, the output terminal of the sixth two-input AND gate outputs binary data Y<0>, the output terminal of the seventh two-input AND gate is connected to the second input terminal of the second stage of three-input AND gate, the second input terminal of the sixth stage of three-input AND gate, the second input terminal of the tenth stage of three-input AND gate and the second input terminal of the fourteenth stage of three-input AND gate, the output terminal of the seventh two-input AND gate outputs binary data Y<1>, the output terminal of the eighth two-input AND gate is connected to the second input terminal of the third stage of three-input AND gate, the second input terminal of the seventh stage of three-input AND gate, the second input terminal of the eleventh stage of three-input AND gate and the second input terminal of the fifteenth stage of three-input AND gate, the output terminal of the eighth two-input AND gate outputs binary data Y<2>, the output terminal of the ninth two-input AND gate is connected to the second input terminal of the fourth stage of three-input AND gate, the second input terminal of the eighth stage of three-input AND gate, the second input terminal of the twelfth stage of three-input AND gate and the second input terminal of the sixteenth stage of three-input AND gate, the output terminal of the ninth two-input AND gate outputs binary data Y<3>, the third input terminals of the 16 stages of three-input AND gates are connected, a connecting terminal is a control terminal of the decoder, the precharge signal PRE is input to the control terminal of the decoder, the output terminal of the $k^{th}$ stage of three-input AND gate is connected to the $k^{th}$ bias voltage converter, and the output terminal of the $k^{th}$ stage of three-input AND gate outputs the $k^{th}$ decoded signal.

Compared with the prior art, the invention has the following advantages: the bistable physical unclonable function circuit based on subthreshold leakage current deviation is formed by a time sequence control circuit, a decoder, 16 bias voltage converters and a PUF array; the time sequence control circuit is controlled by an external clock signal CLK to generate and output a precharge signal PRE and an enable signal AEN; the precharge signal PRE and the enable signal AEN are input to the decoder, the decoder is controlled by the precharge signal PRE and the enable signal AEN to convert an external stimulus signal ADDR<0:3> into 16 decoded signals and output the decoded signals; the $k^{th}$ decoded signal is input to the $k^{th}$ bias voltage converter and is converted by the $k^{th}$ bias voltage converter into a $k^{th}$ word line signal WL<k> which is input to the PUF array; the PUF array is controlled by the precharge signal PRE and the word line signals output by the 16 bias voltage converters to generate response signals and output the response signals in series; the PUF array comprises a first PMOS transistor, a second PMOS transistor, a third PMOS transistor, a fourth PMOS transistor, a first NMOS transistor, a second NMOS transistor, a third NMOS transistor, a fourth NMOS transistor, a first two-input NAND gate, a second two-input NAND gate and 16 PUF units; each PUF unit has a first input terminal, a second input terminal, a first output terminal, a second output terminal and a control terminal, the first two-input NAND gate and second two-input NAND gate each have a first input terminal, a second input terminal and an output terminal, and a width-to-length ratio WP/LP of the first PMOS transistor and the second PMOS transistor is 2 μm/60 nm; an external supply voltage VDD is accessed to a source of the first PMOS transistor and a source of the second PMOS transistor; a gate of the first PMOS transistor and a gate of the second PMOS transistor are connected, a connecting terminal is a control terminal of the PUF array, and the precharge signal PRE is input to the control terminal of the PUF array; a drain of the first PMOS transistor is connected to a source of the third PMOS transistor; a drain of the second PMOS transistor is connected to a source of the fourth PMOS transistor; a gate of the third PMOS transistor, a drain of the fourth PMOS transistor and a gate of the first NMOS transistor are connected to the second input terminal of the first PUF unit; a gate of the fourth PMOS transistor, a drain of the third PMOS transistor and a gate of the second NMOS transistor are connected to the first input terminal of the first PUF unit; the first output terminal of the $j^{th}$ PUF unit is connected to the first input terminal of the $(j+1)^{th}$ PUF unit, the second output terminal of the $j^{th}$ PUF unit is connected to the second input terminal of the $(j+1)^{th}$ PUF unit, and j=1, 2, . . . , 15; the first output terminal of the sixteenth PUF unit is connected to a drain of the first NMOS transistor, and a second output terminal of the sixteenth PUF unit is connected to a drain of the second NMOS transistor; the control terminal of the $k^{th}$ PUF unit is taken as a $k^{th}$ control terminal of the PUF array, and the word line signal WL<k> output by the $k^{th}$ bias voltage converter is input to the $k^{th}$ control terminal of the PUF array; a source of the first NMOS transistor is connected to a drain of the third NMOS transistor; a source of the second NMOS transistor is connected to a drain of the fourth NMOS transistor; a gate of the third NMOS transistor is connected to a gate of the fourth NMOS transistor; a source of the third NMOS transistor is connected to the first input terminal of the first two-input NAND gate; a source of the fourth NMOS transistor is connected to the first input terminal of the second two-input NAND gate; the second input terminal of the first two-input NAND gate is connected to the output terminal of the second two-input NAND gate; the second input terminal of the second two-input NAND gate is connected to the output terminal of the first two-input NAND gate, and a connecting terminal is taken as an output terminal of the PUF array and is used for outputting the response signals; each PUF unit comprises a fifth NMOS transistor and a sixth NMOS transistor, wherein a drain of the fifth NMOS transistor is taken as the first input terminal of the PUF unit, a source of the fifth NMOS transistor is taken as the first output terminal of the PUF unit, a source of the sixth NMOS transistor is taken as the second output terminal of the PUF unit, a gate of the fifth NMOS transistor and a gate of the sixth NMOS transistor are connected, and a connecting terminal is taken as the control terminal of the PUF unit; the first PMOS transistor and the second PMOS transistor form a P-type sharing terminal for isolating the 16 PUF units from the external supply voltage VDD, and because the charge speed of PMOS transistors is lower than the discharge speed of NMOS transistors, the PUF unit formed by the fifth NMOS transistor and the sixth NMOS transistor has better stability and a higher operating speed; the width-to-length ratio of the first PMOS transistor and the second PMOS transistor forming the P-type sharing terminal is set to 2 μm/60 nm, such that the response signals output by the bistable physical unclonable function circuit are prevented from being biased (to 0 or 1); the third PMOS transistor, the fourth PMOS transistor, the first NMOS transistor and the second NMOS transistor form a cross-coupled bistable structure; in each PUF unit, the fifth NMOS transistor and the sixth NMOS transistor N6 are used as gating switch tubes, the current across the fifth NMOS transistor is denoted as I1, the current across the sixth NMOS transistor is denoted as I2, and I1 and I2 are used as bias current sources; when the bistable physical unclonable function circuit works, the external clock signal CLK is input to the time sequence control circuit; the time sequence control circuit generates and outputs the precharge signal PRE and the enable signal AEN; after receiving the precharge signal PRE and the enable signal AEN, the decoder decodes the external stimulus signal ADDR<0:3> to generate and output 16 decoded signals; the 16 bias voltage converters process the 16 decoded signal correspondingly to obtain and output corresponding word line signals, wherein the word line signal output by each bias voltage converter is either the voltage VDD or the bias voltage VBB; when the word line signal output by one bias voltage converter is the bias voltage VBB, the fifth NMOS transistor and the sixth NMOS transistor in the PUF unit connected to said bias voltage converter work in the subthreshold region; 16 word line signals are correspondingly input to the 16 PUF units, the working state of each PUF unit is divided into a precharge phase and an evaluation phase, and under the control of the precharge signal PRE and the 16 word line signals, the 16 PUF units enter the working state sequentially from the first PUF unit to the sixteenth PUF unit; first, a decoded signal WL<0>, which is VBB, is input to the first PUF unit, decoded signals, which are all VDD, are input the other fifteen PUF units which are completely turned on, the precharge signal PRE is a low level, the first PUF unit enters the precharge phase, a connection node of the gate of the second NMOS transistor, the drain of the third PMOS transistor, the gate of the fourth PMOS transistor and the first output terminal of the first PUF unit is denoted as Q, a connection node of the gate of the third PMOS transistor, the drain of the fourth PMOS transistor, the gate of the first NMOS transistor and the second output terminal of the first PUF unit is denoted as QB, and Q and QB are charged to the voltage VDD, then the precharge signal PRE turns into a high level, the first PUF unit enters the evaluation phase, Q and QB start to discharge through the first PUF unit, and because of the current deviation between the current I1 across the fifth NMOS transistor and the current I2 across the sixth NMOS transistor in the first PUF unit, the P-type sharing terminal and the cross-coupled bistable structure, the voltage of the fifth NMOS transistor and the sixth NMOS transistor in the first PUF is quickly amplified, and a stable output response is established quickly; if I1>I2, the voltage at QB is VQB=VDD, and the voltage at Q is VQ=0; if I1<I2, the voltage at QB is VQB=0, and the voltage at Q is VQ=VDD, at this moment, an RS flip-latch formed by the first two-output NAND gate and the second two-output NAND gate outputs a first response signal, and the bistable physical unclonable function circuit completes the output of the first response signal; next, a decoded signal WL<1>, which is VBB, is input to the second PUF unit, decoded signals, which are all VDD, are input to the other fifteen PUF units which are completely turned on, the precharge signal PRE is a low level, the second PUF unit enters the precharge phase and works in a same way as the first PUF unit until the bistable physical unclonable function circuit outputs a second response signal; this process is repeated unit the sixteenth PUF finishes working, and at this moment, one work cycle of the PUF array is completed; and then, a next work cycle is started under the control of the precharge signal PRE, and this process is repeated until the bistable physical unclonable function circuit stops working; the fifth NMOS transistor and the sixth NMOS transistor in each PUF unit are not only used as deviation sources of the bistable physical unclonable function circuit, but also used as switch tubes of the bistable physical unclonable function circuit, such that the number of MOS transistors in the PUF units is reduced, thus drastically reducing the number of MOS transistors in the bistable physical unclonable function circuit, obviously decreasing the overall size of the bistable physical unclonable function circuit, and making the area expenditure small; moreover, the cross-coupled bistable structure formed by the third PMOS transistor, the fourth PMOS transistor, the first NMOS transistor and the second NMOS transistor can quickly amplify the voltage of the fifth NMOS transistor and the sixth NMOS transistor in each PUF unit and can quickly establish a stable output response, thus the bistable physical unclonable function circuit has good robustness and stability; and tests prove that the minimum error rate of the bistable physical unclonable function circuit is 1.16%, and the layout area of the PUF units can reach 0.177 μm², so the bistable physical unclonable function circuit has a low error rate and a small area expenditure, and takes into account both the error rate and the area expenditure.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

The invention will be described in further detail below in conjunction with the accompanying drawings and embodiments.

Figure 1:
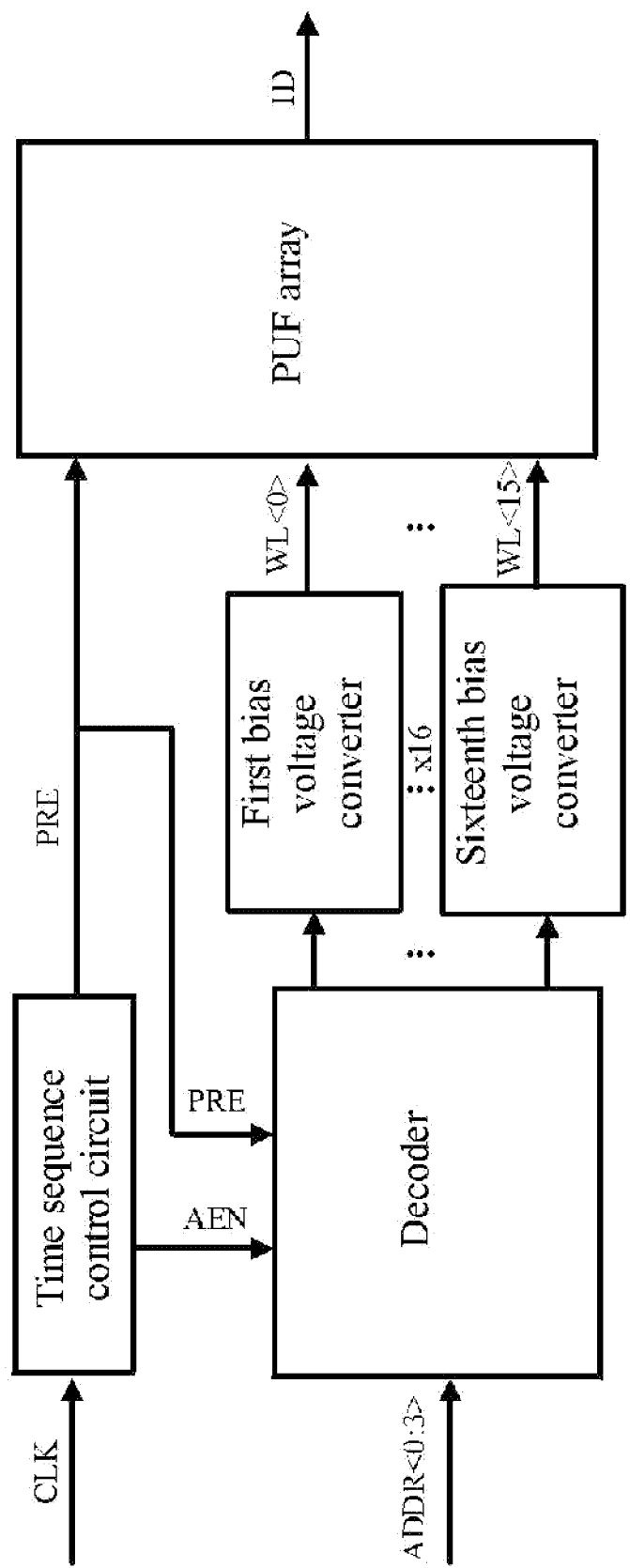
FIG. 1 illustrates the principle and structure of a bistable physical unclonable function circuit based on subthreshold leakage current deviation according to the invention.
Figure 2A:
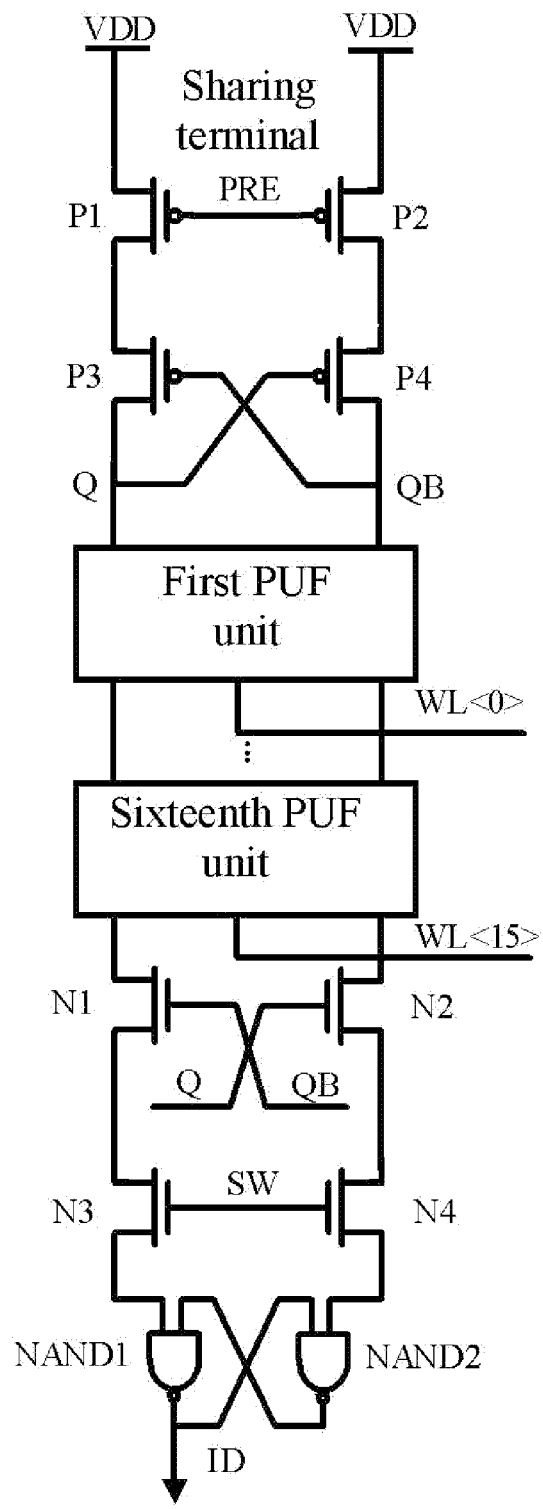
FIG. 2(a) is a circuit diagram of a PUF array of the bistable physical unclonable function circuit based on subthreshold leakage current deviation according to the invention.
Figure 2B:
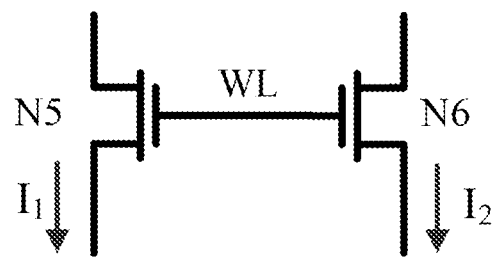
FIG. 2(b) is a circuit diagram of a PUF unit of the bistable physical unclonable function circuit based on subthreshold leakage current deviation according to the invention.

Embodiment: As shown in FIG. 1, a bistable physical unclonable function circuit based on subthreshold leakage current deviation comprises a time sequence control circuit, a decoder, 16 bias voltage converters and a PUF array, wherein the time sequence control circuit is controlled by an external clock signal CLK to generate and output a precharge signal PRE and an enable signal AEN; the precharge signal PRE and the enable signal AEN are input to the decoder, the decoder is controlled by the precharge signal PRE and the enable signal AEN to convert an external stimulus signal ADDR<0:3> into 16 decoded signals and output the decoded signals, the external stimulus signal ADDR<0:3> is a four-bit binary number, a first bit of the external stimulus signal ADDR<0:3> is ADDR<0>, a second bit of the external stimulus signal ADDR<0:3> is ADDR<1>, a third bit of the external stimulus signal ADDR<0:3> is ADDR<2>, and a fourth bit of the external stimulus signal ADDR<0:3> is ADDR<3>; the $k^{th}$ decoded signal is input to the $k^{th}$ bias voltage converter and is converted by the $k^{th}$ bias voltage converter into a $k^{th}$ word line signal WL<k> which is input to the PUF array, wherein k=1, 2, ..., 16; the PUF array is controlled by the precharge signal PRE and the word line signals output by the 16 bias voltage converters to generate and output response signals; as shown in FIG. 1(a), the PUF array comprises a first PMOS transistor P1, a second PMOS transistor P2, a third PMOS transistor P3, a fourth PMOS transistor P4, a first NMOS transistor N1, a second NMOS transistor N1, a third NMOS transistor N3, a fourth NMOS transistor N4, a first two-input NAND gate NAND1, a second two-input NAND gate NAND2 and 16 PUF units; each PUF unit has a first input terminal, a second input terminal, a first output terminal, a second output terminal and a control terminal, the first two-input NAND gate NAND1 and second two-input NAND gate NAND2 each have a first input terminal, a second input terminal and an output terminal, and a width-to-length ratio WP/LP of the first PMOS transistor P1 and the second PMOS transistor P2 is 2 μm/60 nm; an external supply voltage VDD is accessed to a source of the first PMOS transistor P1 and a source of the second PMOS transistor P2, and the value of VDD is 1.0V-1.4V; a gate of the first PMOS transistor P1 and a gate of the second PMOS transistor P2 are connected, a connecting terminal is a control terminal of the PUF array, and the precharge signal PRE is input to the control terminal of the PUF array; a drain of the first PMOS transistor P1 is connected to a source of the third PMOS transistor P3; a drain of the second PMOS transistor P2 is connected to a source of the fourth PMOS transistor P4; a gate of the third PMOS transistor P3, a drain of the fourth PMOS transistor P4 and a gate of the first NMOS transistor N1 are connected to the second input terminal of the first PUF unit; a gate of the fourth PMOS transistor P4, a drain of the third PMOS transistor P3 and a gate of the second NMOS transistor N2 are connected to the first input terminal of the first PUF unit; the first output terminal of the $j^{th}$ PUF unit is connected to the first input terminal of the $(j+1)^{th}$ PUF unit, the second output terminal of the $j^{th}$ PUF unit is connected to the second input terminal of the $(j+1)^{th}$ PUF unit, and j=1, 2, ..., 15; the first output terminal of the sixteenth PUF unit is connected to a drain of the first NMOS transistor N1, and a second output terminal of the sixteenth PUF unit is connected to a drain of the second NMOS transistor N2; the control terminal of the $k^{th}$ PUF unit is taken as a $k^{th}$ control terminal of the PUF array, and the word line signal WL<k> output by the $k^{th}$ bias voltage converter is input to the $k^{th}$ control terminal of the PUF array; a source of the first NMOS transistor N1 is connected to a drain of the third NMOS transistor N3; a source of the second NMOS transistor N2 is connected to a drain of the fourth NMOS transistor N4; a gate of the third NMOS transistor N3 is connected to a gate of the fourth NMOS transistor N4; a source of the third NMOS transistor N3 is connected to the first input terminal of the first two-input NAND gate NAND1; a source of the fourth NMOS transistor N4 is connected to the first input terminal of the second two-input NAND gate NAND2; the second input terminal of the first two-input NAND gate NAND1 is connected to the output terminal of the second two-input NAND gate NAND2; the second input terminal of the second two-input NAND gate NAND2 is connected to the output terminal of the first two-input NAND gate NAND1, and a connecting terminal is taken as an output terminal of the PUF array and is used for outputting the response signals; as shown in FIG. 2(b), the each PUF unit comprises a fifth NMOS transistor N5 and a sixth NMOS transistor N6, wherein a drain of the fifth NMOS transistor N5 is taken as the first input terminal of the PUF unit, a source of the fifth NMOS transistor N5 is taken as the first output terminal of the PUF unit, a source of the sixth NMOS transistor N6 is taken as the second output terminal of the PUF unit, a gate of the fifth NMOS transistor N5 and a gate of the sixth NMOS transistor N6 are connected, and a connecting terminal is taken as the control terminal of the PUF unit.

Figure 3A:
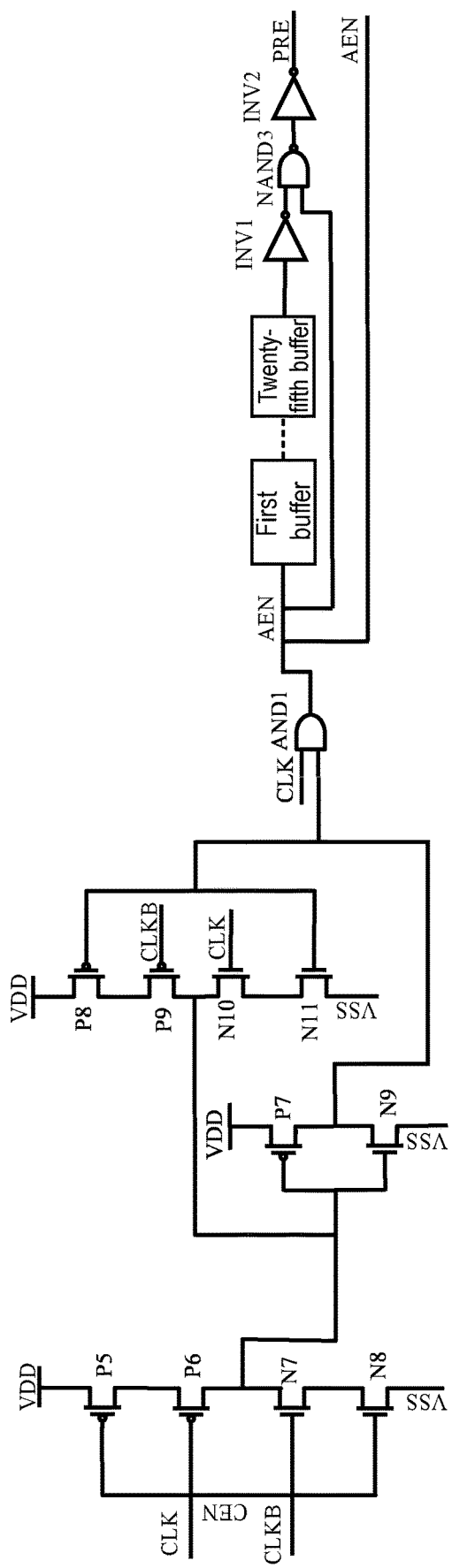
FIG. 3(a) is a circuit diagram of a time sequence control circuit of the bistable physical unclonable function circuit based on subthreshold leakage current deviation according to the invention.

As shown in FIG. 3(a), in this embodiment, the time sequence control circuit comprises a fifth PMOS transistor P5, a sixth PMOS transistor P6, a seventh PMOS transistor P7, an eighth PMOS transistor P8, a ninth PMOS transistor P9, a seventh NMOS transistor N7, an eighth NMOS transistor N8, a ninth NMOS transistor N9, a tenth NMOS transistor N10, an eleventh NMOS transistor N11, a first two-input AND gate AND1, a first inverter INV1, a second inverter INV2, a third two-input NAND gate NAND3 and 25 buffers, wherein the first two-input AND gate AND1 and the third two-input NAND gate NAND3 each have a first input terminal, a second input terminal and an output terminal; the external supply voltage VDD is accessed to the source of the first PMOS transistor P1, a source of the seventh PMOS transistor P7 and a source of the eighth PMOS transistor P8; a gate of the fifth PMOS transistor P5 is connected to a gate of the eighth NMOS transistor N8; a drain of the fifth PMOS transistor P5 is connected to a source of the sixth PMOS transistor P6; a drain of the sixth PMOS transistor P6, a drain of the seventh NMOS transistor N7, a gate of the seventh PMOS transistor P7, a gate of the ninth NMOS transistor N9, a drain of the ninth PMOS transistor P9 and a drain of the tenth NMOS transistor N10 are connected; a source of the seventh NMOS transistor N7 is connected to a drain of the eighth NMOS transistor N8; a source of the eighth NMOS transistor N8 is grounded; a gate of the sixth PMOS transistor P6 and a gate of the tenth NMOS transistor N10 are connected to the first input terminal of the first two-input AND gate AND1, and a connecting terminal is a clock terminal of the time sequence control circuit, and the external clock signal CLK is input to the clock terminal of the time sequence control circuit; a gate of the seventh NMOS transistor N7 is connected to a gate of the ninth PMOS transistor P9; a gate of the seventh PMOS transistor P7, a drain of the ninth NMOS transistor N9, a gate of the eighth PMOS transistor P8 and a gate of the eleventh NMOS transistor N11 are connected to the second input terminal of the first two-input AND gate; a source of the ninth NMOS transistor N9 and a source of the eleventh NMOS transistor N11 are grounded; a drain of the eighth PMOS transistor P8 is connected to a source of the ninth PMOS transistor P9; a source of the tenth NMOS transistor N10 is connected to a drain of the eleventh NMOS transistor N11; the output terminal of the first two-input AND gate AND1, an output terminal of the first buffer and the first input terminal of the third two-input NAND gate NAND3 are connected, a connecting terminal is an enable output terminal of the time sequence control circuit, and the enable output terminal of the time sequence control circuit is used for outputting the enable signal AEN; an output terminal of the $m^{th}$ buffer is connected to an input terminal of the $(m+1)^{th}$ buffer, and m=1, 2, ..., 24; an output terminal of the twenty-fifth buffer is connected to an input terminal of the first inverter INV1, an output terminal of the first inverter INV1 is connected to the second input terminal of the third two-input NAND gate NAND3, the output terminal of the third two-input NAND gate NAND3 is connected to an input terminal of the second inverter INV2, an output terminal of the second inverter INV2 is a control output terminal of the time sequence control circuit, and the control output terminal of the time sequence control circuit is used for outputting the precharge signal PRE.

Figure 2C:
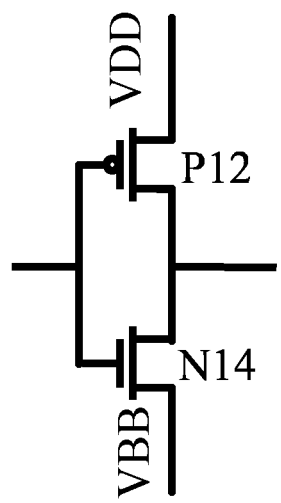
FIG. 2(c) is a circuit diagram of a bias voltage converter of the bistable physical unclonable function circuit based on subthreshold leakage current deviation according to the invention.

As shown in FIG. 2(c), in this embodiment, each of the 16 bias voltage converters comprises a twelfth PMOS transistor P12 and a fourteenth NMOS transistor N14, wherein a gate of the twelfth PMOS transistor P12 and a gate of the fourteenth NMOS transistor N14 are connected, a connecting terminal is taken as an input terminal of the bias voltage converter, to which one decoded signal output by the decoder is input; a drain of the twelfth PMOS transistor P12 and a drain of the fourteenth NMOS transistor N14 are connected, and a connecting terminal is taken as an output terminal of the bias voltage converter, which is used for outputting the word line signal; the external supply voltage VDD is input to a source of the twelfth PMOS transistor P12; an external bias voltage VBB is input to a source of the fourteenth NMOS transistor N14, and the value of VBB is 300 mV-425 mV; under the control of the decoded signal input to the input terminal of the bias voltage converter, the output terminal of the bias voltage converter outputs the voltage VDD or the bias voltage VBB; when the decoded signal input to the input terminal of the bias voltage converter is a high level, the twelfth PMOS transistor P12 is turned off, the fourteenth NMOS N14 is turned on, and the output terminal of the bias voltage converter outputs the bias voltage VBB; when the decoded signal input to the input terminal of the bias voltage converter is a low level, the twelfth PMOS transistor P12 is turned on, the fourteenth NMOS N14 is turned off, and the output terminal of the bias voltage converter outputs the voltage VDD. In this way, the word line signal output by each bias voltage converter is either the voltage VDD or the bias voltage VBB.

Figure 3B:
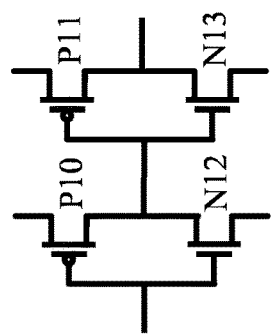
FIG. 3(b) is a circuit diagram of a buffer of the bistable physical unclonable function circuit based on subthreshold leakage current deviation according to the invention.

As shown in FIG. 3(b), in this embodiment, each buffer comprises a tenth PMOS transistor P10, an eleventh PMOS transistor P11, a twelfth NMOS transistor N12 and a thirteenth NMOS transistor N13, wherein the external supply voltage VDD is accessed to a source of the tenth PMOS transistor P10 and a source of the eleventh PMOS transistor P11; a gate of the tenth PMOS transistor P10 and a gate of the twelfth NMOS transistor N12 are connected, and a connecting terminal is an input terminal of the buffer; a drain of the tenth PMOS transistor P10, a drain of the twelfth NMOS transistor N12, a gate of the eleventh PMOS transistor P11 and a gate of the thirteenth NMOS transistor N13 are connected; a drain of the eleventh PMOS transistor P11 and a drain of the thirteenth NMOS transistor N13 are connected, and a connecting terminal is an output terminal of the buffer; and a source of the twelfth NMOS transistor N12 and a source of the thirteenth NMOS transistor N13 are grounded.

Figure 4:
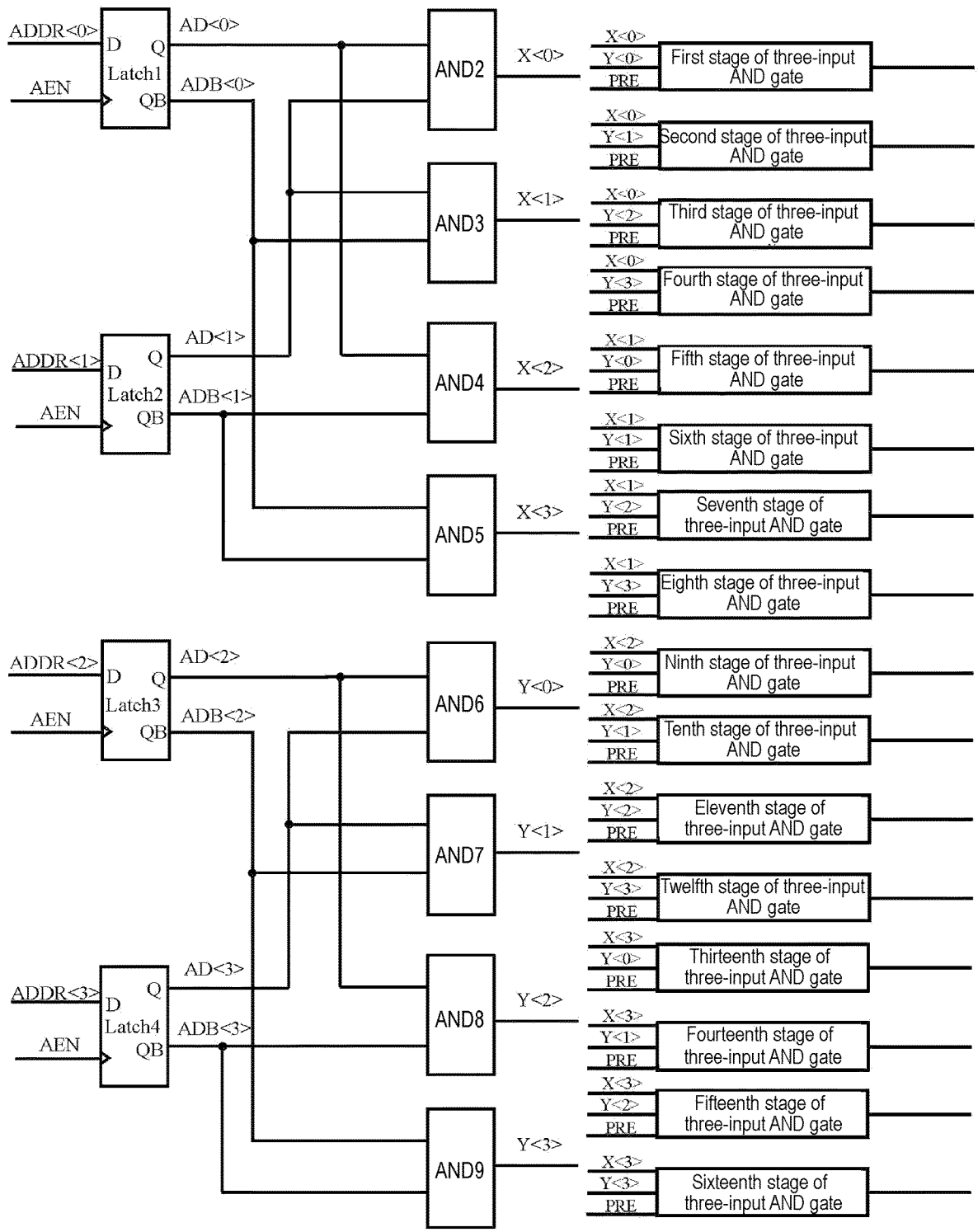
FIG. 4 is a circuit diagram of a decoder of the bistable physical unclonable function circuit based on subthreshold leakage current deviation according to the invention.

As shown in FIG. 4, in this embodiment, the decoder comprises a first flip-latch Latch1, a second flip-latch Latch2, a third flip-latch Latch3, a fourth flip-latch Latch4, a second two-input AND gate AND2, a third two-input AND gate AND3, a fourth two-input AND gate AND4, a fifth two-input AND gate AND5, a sixth two-input AND gate AND6, a seventh two-input AND gate AND7, an eighth two-input AND gate AND8, a ninth two-input AND gate AND9 and 16 stages of three-input AND gate, wherein the first flip-latch Latch1, the second flip-latch Latch2, the third flip-latch Latch3 and the fourth flip-latch Latch4 each have an input terminal, an enable terminal, an output terminal and an inverse output terminal; the second two-input AND gate AND2, the third two-input AND gate AND3, the fourth two-input AND gate AND4, the fifth two-input AND gate AND5, the sixth two-input AND gate AND6, the seventh two-input AND gate AND7, the eighth two-input AND gate AND8 and the ninth two-input AND gate AND9 each have a first input terminal, a second input terminal and an output terminal; and each stage of three-input AND gate has a first input terminal, a second input terminal, a third input terminal and an output terminal; the enable terminal of the first flip-latch Latch1, the enable terminal of the second flip-latch Latch2, the enable terminal of the third flip-latch Latch3 and the enable terminal of the fourth flip-latch Latch4 are connected, a connecting terminal is an enable terminal of the decoder, and the enable signal AEN is input to the enable terminal of the decoder; ADDR<0> is input to the input terminal of the first flip-latch Latch1, ADDR<1> is input to the input terminal of the second flip-latch Latch2, ADDR<2> is input to the input terminal of the third flip-latch Latch3, ADDR<3> is input to the input terminal of the fourth flip-latch Latch4, the output terminal of the first flip-latch Latch1 outputs a first latch signal AD<0>, the inverse output terminal of the first flip-latch Latch1 outputs a first inverse signal ADB<0>, the output terminal of the second flip-latch Latch2 outputs a second latch signal AD<1>, the inverse output terminal of the second flip-latch Latch2 outputs a second inverse signal ADB<1>, the output terminal of the third flip-latch Latch3 outputs a third latch signal AD<2>, the inverse output terminal of the third flip-latch Latch3 outputs a third inverse signal ADB<2>, the output terminal of the fourth flip-latch Latch4 outputs a fourth latch signal AD<3>, and the inverse output terminal of the fourth flip-latch Latch4 outputs a fourth inverse signal ADB<3>; the output terminal of the first flip-latch Latch1 is connected to the first input terminal of the second two-input AND gate AND2 and the first input terminal of the fourth two-input AND gate AND4, the reverse output terminal of the first flip-latch Latch1 is to the second input terminal of the third two-input AND gate AND3 and the first input terminal of the fifth two-input AND gate AND5, the output terminal of the second flip-latch Latch2 is connected to the second input terminal of the second two-input AND gate AND2 and the first input terminal of the third two-input AND gate AND3, the reverse output terminal of the second flip-latch Latch2 is to the second input terminal of the fourth two-input AND gate AND4 and the second input terminal of the fifth two-input AND gate AND5, the output terminal of the third flip-latch Latch3 is connected to the first input terminal of the sixth two-input AND gate AND6 and the first input terminal of the eighth two-input AND gate AND8, the reverse output terminal of the third flip-latch Latch3 is to the second input terminal of the seventh two-input AND gate AND7 and the first input terminal of the ninth two-input AND gate AND9, the output terminal of the fourth flip-latch Latch4 is connected to the second input terminal of the sixth two-input AND gate AND6 and the first input terminal of the seventh two-input AND gate AND7, the reverse output terminal of the fourth flip-latch Latch4 is to the second input terminal of the eighth two-input AND gate AND8 and the second input terminal of the ninth two-input AND gate AND9, the output terminal of the second two-input AND gate AND2 is connected to the first input terminal of the first stage of three-input AND gate, the first input terminal of the second stage of three-input AND gate, the first input terminal of the third stage of three-input AND gate and the first input terminal of the fourth stage of three-input AND gate, the output terminal of the second two-input AND gate AND2 outputs binary data X<0>, the output terminal of the third two-input AND gate AND3 is connected to the first input terminal of the fifth stage of three-input AND gate, the first input terminal of the sixth stage of three-input AND gate, the first input terminal of the seventh stage of three-input AND gate and the first input terminal of the eighth stage of three-input AND gate, the output terminal of the third two-input AND gate AND3 outputs binary data X<1>, the output terminal of the fourth two-input AND gate AND4 is connected to the first input terminal of the ninth stage of three-input AND gate, the first input terminal of the tenth stage of three-input AND gate, the first input terminal of the eleventh stage of three-input AND gate and the first input terminal of the twelfth stage of three-input AND gate, the output terminal of the fourth two-input AND gate AND4 outputs binary data X<2>, the output terminal of the fifth two-input AND gate AND5 is connected to the first input terminal of the thirteenth stage of three-input AND gate, the first input terminal of the fourteenth stage of three-input AND gate, the first input terminal of the fifteenth stage of three-input AND gate and the first input terminal of the sixteenth stage of three-input AND gate, the output terminal of the fifth two-input AND gate AND5 outputs binary data X<3>, the output terminal of the sixth two-input AND gate AND6 is connected to the second input terminal of the first stage of three-input AND gate, the second input terminal of the fifth stage of three-input AND gate, the second input terminal of the ninth stage of three-input AND gate and the second input terminal of the thirteenth stage of three-input AND gate, the output terminal of the sixth two-input AND gate AND6 outputs binary data Y<0>, the output terminal of the seventh two-input AND gate AND7 is connected to the second input terminal of the second stage of three-input AND gate, the second input terminal of the sixth stage of three-input AND gate, the second input terminal of the tenth stage of three-input AND gate and the second input terminal of the fourteenth stage of three-input AND gate, the output terminal of the seventh two-input AND gate AND7 outputs binary data Y<1>, the output terminal of the eighth two-input AND gate AND8 is connected to the second input terminal of the third stage of three-input AND gate, the second input terminal of the seventh stage of three-input AND gate, the second input terminal of the eleventh stage of three-input AND gate and the second input terminal of the fifteenth stage of three-input AND gate, the output terminal of the eighth two-input AND gate AND8 outputs binary data Y<2>, the output terminal of the ninth two-input AND gate AND9 is connected to the second input terminal of the fourth stage of three-input AND gate, the second input terminal of the eighth stage of three-input AND gate, the second input terminal of the twelfth stage of three-input AND gate and the second input terminal of the sixteenth stage of three-input AND gate, the output terminal of the ninth two-input AND gate AND9 outputs binary data Y<3>, the third input terminals of the 16 stages of three-input AND gates are connected, a connecting terminal is a control terminal of the decoder, the precharge signal PRE is input to the control terminal of the decoder, the output terminal of the $k^{th}$ stage of three-input AND gate is connected to the $k^{th}$ bias voltage converter, and the output terminal of the $k^{th}$ stage of three-input AND gate outputs the $k^{th}$ decoded signal. In this embodiment, the first PMOS transistor P1 and the second PMOS transistor P2 form a P-type sharing terminal for isolating the 16 PUF units from the external supply voltage VDD, and because the charge speed of PMOS transistors is lower than the discharge speed of NMOS transistors, the PUF unit formed by the fifth NMOS transistor N5 and the sixth NMOS transistor N6 has better stability and a higher operating speed; the width-to-length ratio of the first PMOS transistor P1 and the second PMOS transistor P2 forming the P-type sharing terminal is set to 2 μm/60 nm, such that the response signals output by the bistable physical unclonable function circuit are prevented from being biased (to 0 or 1); the third PMOS transistor P3, the fourth PMOS transistor P4, the first NMOS transistor N1 and the second NMOS transistor N2 form a cross-coupled bistable structure; in each PUF unit, the fifth NMOS transistor N5 and the sixth NMOS transistor N6 are used as gating switch tubes, the current across the fifth NMOS transistor is denoted as I1, the current across the sixth NMOS transistor is denoted as I2, and I1 and I2 are used as bias current sources; due to the presence of the 16 bias voltage converters, the fifth NMOS transistor N5 and the sixth NMOS transistor N6 in each PUF unit can work in a subthreshold region, such that the sensitivity to the deviation between the currents across the two transistors is maximized; when the bistable physical unclonable function circuit works, the external clock signal CLK is input to the time sequence control circuit and enhances the drive capacity through the first two-input AND gate AND1, and the 25 buffers control the duty cycle of the external clock signal CLK; the time sequence control circuit generates and outputs the precharge signal PRE and the enable signal AEN; after receiving the precharge signal PRE and the enable signal AEN, the decoder decodes the external stimulus signal ADDR<0:3>, wherein the second two-input AND gate AND2, the third two-input AND gate AND3, the fourth two-input AND gate AND4, the fifth two-input AND gate AND5, the sixth two-input AND gate AND6, the seventh two-input AND gate AND2, the eighth two-input AND gate AND8, the first flip-latch Latch1, the second flip-latch Latch2, the third flip-latch Latch3 and the fourth flip-latch Latch4 form a 2-4 decoder, the 16 stages of three-input AND gates form a 3-8 decoder; and during decoding, the external stimulus signal ADDR<0:3> is processed by the first flip-latch Latch1, the second flip-latch Latch2, the third flip-latch Latch3 and the fourth flip-latch Latch4 to generate latch signals AD[0:3] and revers signals ADB[0:3] of the latch signals AD[0:3], which are correspondingly input to the second two-input AND gate AND2, the third two-input AND gate AND3, the fourth two-input AND gate AND4, the fifth two-input AND gate AND5, the sixth two-input AND gate AND6, the seventh two-input AND gate AND2 and the eighth two-input AND gate AND8, wherein the latch signals AD[0:3] comprise a first latch signal AD<0>, a second latch signal AD<1>, a third latch signal AD<2> and a fourth latch signal AD<3>, and the revers signals ADB[0:3] comprise a first revers signal ADB<0>, a second revers signal ADB<1>, a third revers signal ADB<2> and a fourth revers signal ADB<3>; the eight two-input AND gates generate and output two paths of data based on the latch signals AD[0:3] and the revers signals ADB[0:3], wherein the first path of data is denoted as X[0:3], the second path of data is denoted as Y[0:3], X[0:3] comprises first data X<0>, second data X<1>, third data X<2> and fourth data X<3>, and Y[0:3] comprises first data Y<0>, second data Y<1>, third data Y<2> and fourth data Y<3>1; X[0:3] and Y[0:3] are input to the 16 stages of three-input AND gates for secondary decoding to generate and output 16 decoded signals, and the 16 bias voltage converters process the 16 decoded signal correspondingly to obtain and output corresponding word line signals, wherein the word line signal output by each bias voltage converter is either the voltage VDD or the bias voltage VBB; when the word line signal output by one bias voltage converter is the bias voltage VBB, the fifth NMOS transistor N5 and the sixth NMOS transistor N6 in the PUF unit connected to said bias voltage converter work in the subthreshold region; 16 word line signals are correspondingly input to the 16 PUF units, the working state of each PUF unit is divided into a precharge phase and an evaluation phase, and under the control of the precharge signal PRE and the 16 word line signals, the 16 PUF units enter the working state sequentially from the first PUF unit to the sixteenth PUF unit; first, a decoded signal WL<0>, which is VBB, is input to the first PUF unit, decoded signals, which are all VDD, are input the other fifteen PUF units which are completely turned on, the precharge signal PRE is a low level, the first PUF unit enters the precharge phase, a connection node of the gate of the second NMOS transistor N2, the drain of the third PMOS transistor P3, the gate of the fourth PMOS transistor P4 and the first output terminal of the first PUF unit is denoted as Q, a connection node of the gate of the third PMOS transistor P3, the drain of the fourth PMOS transistor P4, the gate of the first NMOS transistor N1 and the second output terminal of the first PUF unit is denoted as QB, and Q and QB are charged to the voltage VDD, then the precharge signal PRE turns into a high level, the first PUF unit enters the evaluation phase, Q and QB start to discharge through the first PUF unit, and because of the current deviation between the current I1 across the fifth NMOS transistor N5 and the current I2 across the sixth NMOS transistor N6 in the first PUF unit, the P-type sharing terminal and the cross-coupled bistable structure, the voltage of the fifth NMOS transistor N5 and the sixth NMOS transistor N6 in the first PUF is quickly amplified, and a stable output response is established quickly; because the bistable physical unclonable function circuit uses the inevitable process deviation of devices during the fabrication process and it is impossible to clone the same device structure, the value of I1 is different from the value of I2; if I1>I2, the voltage at QB is VQB=VDD, and the voltage at Q is VQ=0; if I1<I2, the voltage at QB is VQB=0, and the voltage at Q is VQ=VDD, at this moment, an RS flip-latch formed by the first two-output NAND gate NAND1 and the second two-output NAND gate NAND2 outputs a first response signal, and the bistable physical unclonable function circuit completes the output of the first response signal; next, a decoded signal WL<1>, which is VBB, is input to the second PUF unit, decoded signals, which are all VDD, are input to the other fifteen PUF units which are completely turned on, the precharge signal PRE is a low level, the second PUF unit enters the precharge phase and works in a same way as the first PUF unit until the bistable physical unclonable function circuit outputs a second response signal; this process is repeated unit the sixteenth PUF finishes working, and at this moment, one work cycle of the PUF array is completed; and then, a next work cycle is started under the control of the precharge signal PRE, and this process is repeated until the bistable physical unclonable function circuit stops working.

Figure 5:
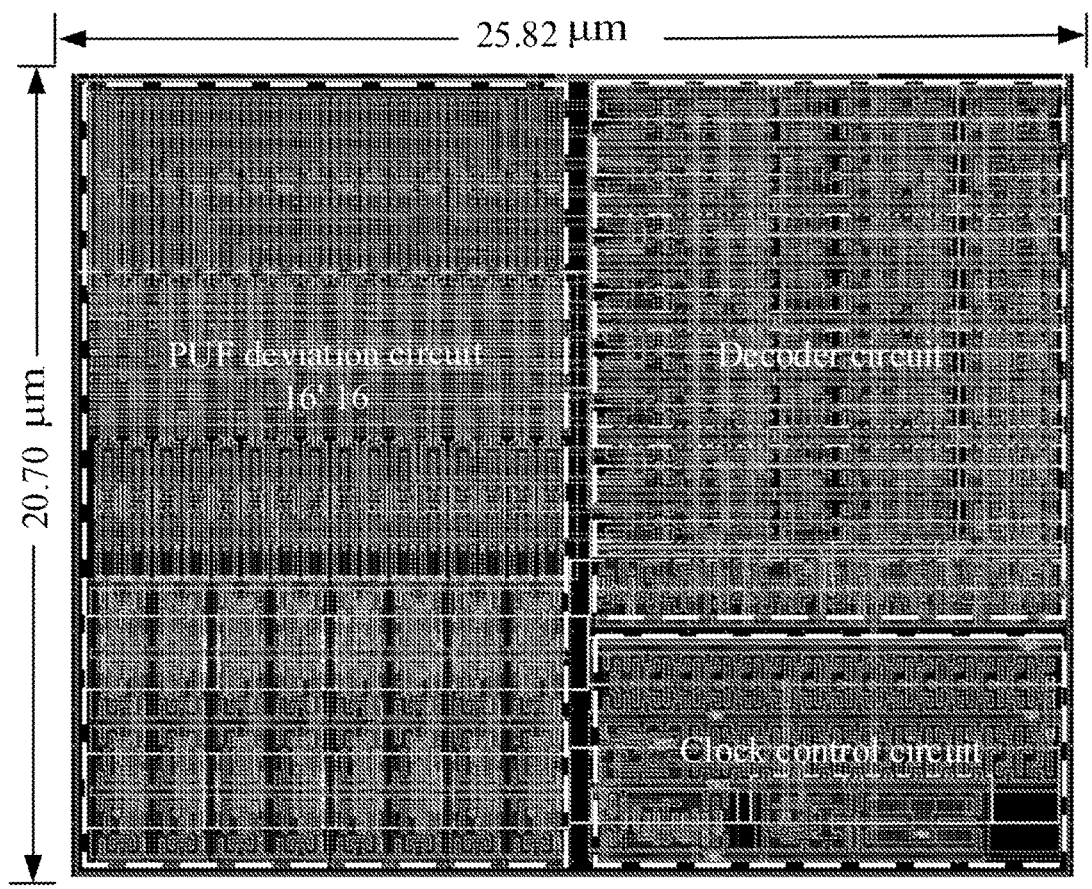
FIG. 5 illustrates the layout of the decoder of the bistable physical unclonable function circuit based on subthreshold leakage current deviation according to the invention.

The bistable physical unclonable function circuit based on subthreshold leakage current deviation in this embodiment is implemented under a TSMC 65 nm CMOS process. Candence Layout is used for fully-customized layout design of the bistable physical unclonable function circuit based on subthreshold leakage current deviation in this embodiment, and as shown in FIG. 5, the overall layout area is 25.80 μm×20.70 m, and the layout area of each PUF unit is 0.177 m² The PUF array is located on the right side of the layout, the decoder is located on the upper right side of the layout, and the time sequence control circuit is located on the lower right side of the layout. The whole layout design adopts four layers of metal (METL1-METL4), wherein METL1 and METL2 are used for internal signals of the bistable physical unclonable function circuit, METL3 is used for wire arrangement for the enable signal, and METL4 is used for connecting the decoder and the PUF units. In order to reduce capacitive coupling between metal wires on the four layers, the metal wires on each layer are arranged vertically.

The stability of the PUC circuit refers to the capacity to keep output characteristic quantities unchanged of the PUC circuit when environmental factors such as temperature and supply voltage change. Generally, the stability of the PUF circuit is evaluated by the error rate and instable bits (bits to which at least one error happens during multiple tests), and the output stability of the PUF circuit is affected mainly by power noise, voltage and temperature. In order to reflect the variation of the stability of the PUF circuit with temperature and voltage, 12,800 bits of responses generated by 50 Monte Carlo simulations are tested under different voltages and temperatures, and are compared with a reference response, which is obtained under the conditions of VDD=1.2V and T=27° C. The relation between the error rate and VBB is shown in Table 1.

TABLE 1

Relation between the error rate and VBB
(result of 50 Monte Carlo simulations)

| VBB (mV) | 300 | 325 | 350 | 375 | 400 | 425 |
|---|---|---|---|---|---|---|
| Highest error rate | 4.72 | 2.37 | 1.68 | 1.37 | 2.24 | 3.42 |
| Average error rate | 2.35 | 1.39 | 1.27 | 1.16 | 1.92 | 2.58 |

Through an analysis on Table 1, it can be known, by comparing the responses of the bistable physical unclonable function circuit under the bias voltage of VBB=375 mV with the responses of the bistable physical unclonable function circuit under the conditions of VDD=1.0-1.4V and T=0-80° C., that the error rate is minimized to 1.16%.

The randomness represents the uniformity of the output responses of the PUF circuit, and is mainly evaluated by the distribution of the probability of logic 0 and the probability of logic 1 in the output responses of the PUF circuit. Under an ideal condition, the logic 0 and the logic 1 are distributed uniformly, and the probability of logic 0 and the probability of logic 1 are both close to 50%, which can be expressed as:

$$\text{Randomness} = (1 - |2P(R=1) - 1|) \times 100\% \quad (1)$$

Where, P (R=1) represents the probability of logic 1 in output data.

Figure 6A:
FIG. 6(a) is a gray-scale map of response signals output by the bistable physical unclonable function circuit based on subthreshold leakage current deviation according to the invention.
Figure 6B:
FIG. 6(b) is an average gray-scale map of the response signals output by the bistable physical unclonable function circuit based on subthreshold leakage current deviation according to the invention.

Gray-scale maps are often used during randomness tests. Output responses of PUF circuits are mapped into the gray-scale maps, in which the black pixel indicates that a response is logic 1, and the white pixel indicates that a response is logic 0. The grapy-scale maps of a randomly selected bistable physical unclonable function circuit are shown in FIG. 6(a) and FIG. 6(b). It can be known, by analyzing FIG. 6(a) and FIG. 6(b), that the probability of logic 1 (47.4%) is close to the ideal value 50%. The same statistical result is obtained when the other bistable physical unclonable function circuits are tested. The average gray-scale values of the output responses of 50 bistable physical unclonable function circuits in the gray-scale maps are in the vicinity of 0.5, and have not obvious spatial correlation.

The uniqueness is used to represent the distinction degree of different PUF circuits, that is, to reflect the capacity of one PUF circuit to distinguishing itself from other PUF circuits. When the same stimulus is applied to different PUF circuits, the output responses generated by these PUF circuits will be different. The average inter-Hamming distance (Inter-HD) is often used to evaluate the uniqueness of the PUF circuits. Under an ideal condition, the uniqueness is 50%. The average inter-hamming distance ($HD_{Inter}$) of k bistable physical unclonable function circuits is as follows:

$$HD_{Inter} = \frac{2}{k(k-1)} \sum_{i=1}^{k-1} \sum_{j=i+1}^{k} \frac{HD(R_i, R_j)}{N} \times 100\% \quad (2)$$

Where, $R_i$ an $R_j$ respectively represents n bits of output responses generate by the $i^{th}$ bistable physical unclonable function circuit and n bits of output responses generated by the $j^{th}$ bistable physical unclonable function circuit under the same stimulus.

Figure 7:
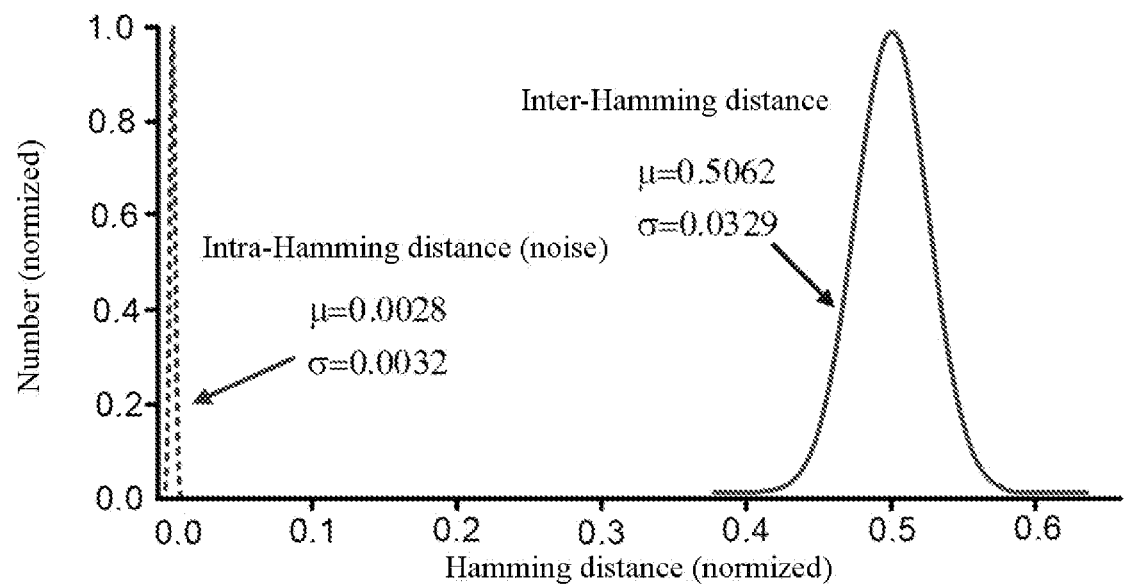
FIG. 7 illustrates a fit curve of the intra-Hamming distance and inter-Hamming distance of the bistable physical unclonable function circuit based on subthreshold leakage current deviation according to the invention.
Figure 8:
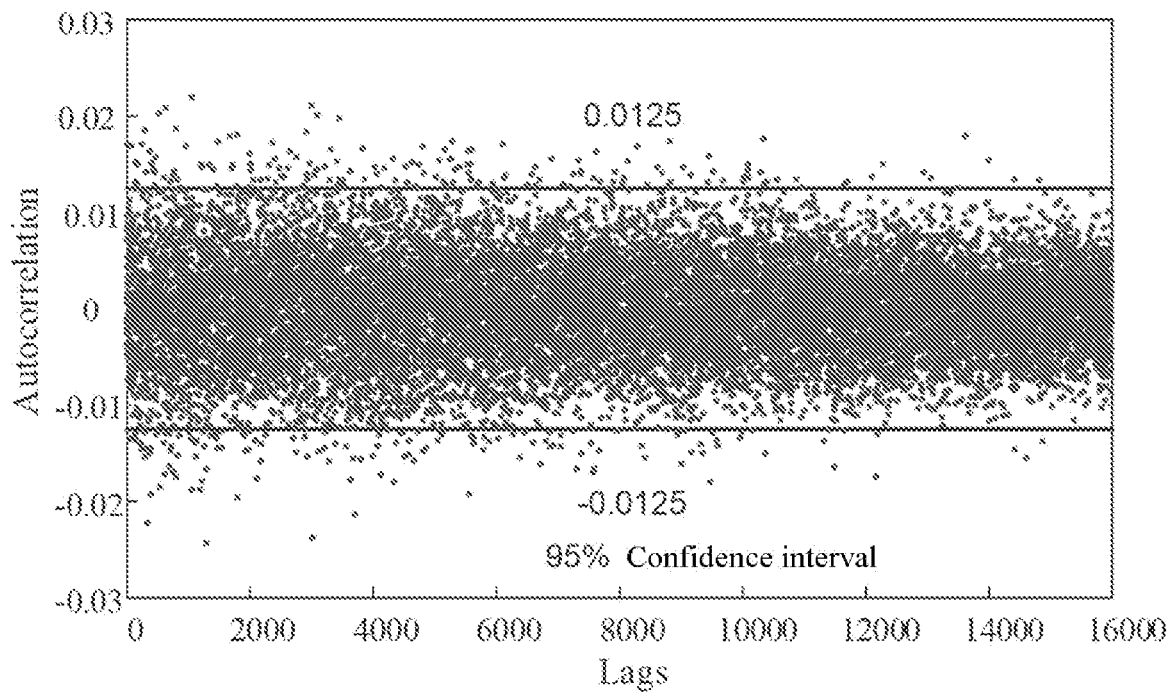
FIG. 8 illustrates autocorrelation test results of the bistable physical unclonable function circuit based on subthreshold leakage current deviation according to the invention.

In order to test the accuracy of the bistable physical unclonable function circuit, 100 Monte Carlo simulations are carried out on the bistable physical unclonable function circuit to obtain 25,600 output responses, and HD between the responses is calculated, wherein the intra-Hamming distance is obtained by introducing transient noise based on the 100 Monte Carlo simulations, which is shown in FIG. 7. It can be known, by analyzing FIG. 7 which illustrates the fit curve of the HD of PUFs (the full line in FIG. 7), that after normalization, the fitted inter-Hamming distance and intra-Hamming distance are 0.5062 and 0.0329 respectively, which corresponding the uniqueness close to the ideal value 50%, indicating that the bistable physical unclonable function circuit has good uniqueness. Also, an autocorrelation function (ACF) is used to quantify the uniqueness, and the test result is shown in FIG. 8. As shown in FIG. 8, within the confidence interval of 95%, the ACF value of the bistable physical unclonable function circuit is 0.0125, and with the decrease of the ACF function, the correlation of output responses becomes lower, indicating that the bistable physical unclonable function circuit has good spatial independence and randomness.

Upon simulations under the optimal bias voltage condition (VBB=0.375V), comparison results of relevant performance of the bistable physical unclonable function circuit of the invention and other similar PUF circuits are shown in Table 2.

TABLE 2

Comparison of tested performance of the invention and relevant literature

|  | Comparative Literature | | | | The invention |
|---|---|---|---|---|---|
|  | JSSC'16 | ISSC'17 | JSSC'18 | JSSC'21 | |
| Process size (nm) | 65 | 180 | 45 | 130 | 65 |
| Number of units | 6 | 12 | 30 | 8 | 2 |
| Area of units ($\mu m^2$) | 3.07 | 17.91 | 5.83 | 8 | 0.177 |
| Feature size of PUF unit | 548 | 553 | 57.5 | 497 | 41.91 |
| Voltage range (V) | 0.6-1.2 | 0.8-1.8 | 0.8-1.0 | 0.8-1.8 | 1.0-1.4 |
| Temperature range (° C.) | 0-80 | −40-120 | −40-125 | −40-120 | 0-80 |
| ACF @ 95% confidence interval | 0.0188 | 0.0173 | 0.00735 | 0.0334 | 0.0125 |
| Average error rate (%) | 6.54 | 1.67 | 3.48 | 2.71 | 1.16 |
| Energy consumption (fJ/bit) | 548 | 91.1 | 57.5 | 15.39 | 8.976 |

In table 2, JSSC'16 is the PUF circuit disclosed in Literature Li J, Seok M, et al. *Ultra-Compact and Robust Physically Unclonable Function Based on Voltage-Compensated Proportional-to-Absolute-Temperature Voltage Generators* [J]. *IEEE Journal of Solid-State Circuits*, 2016, 51(9):2192-2202. doi: 10.1109 JSSC.2016.2586498., ISSC'17 is the PUF circuit disclosed in Literature K. Yang, Q. Dong, D. Blaauw, et al., 8.3 *A 553F2 2-transistor amplifier-based Physically Unclonable Function (PUF) with 1.67% native instability*[C], 2017 *IEEE International Solid-State Circuits Conference (ISSCC)*, 2017, pp. 146-147, doi: 10.1109 ISSCC.2017.7870303., JSSC'18 is the PUF circuit disclosed in Literature S. Taneja, A. B. Alvarez, M Alioto, et al., *Fully Synthesizable PUF Featuring Hysteresis and Temperature Compensation for 3.2% Native BER and 1.02 fJ/b in 40 nm*[J], *IEEE Journal of Solid-State Circuits*, vol. 53, no. 10, pp. 2828-2839, October 2018, doi: 10.1109 JSSC.2018.2865584., and JSSC'21 is the PUF circuit disclosed in Literature K. Liu, X Chen, H. Pu, et al. *A 0.5-V Hybrid SRAM Physically Unclonable Function Using Hot Carrier Injection Burn-In for Stability Reinforcement*[J], *IEEE Journal of Solid-State Circuits*, vol. 56, no. 7, pp. 2193-2204, July 2021, doi: 10.1109 JSSC.2020.3035207.

It can be known, by analyzing table 2, that in the aspect of area and power consumption, the bistable physical unclonable function circuit provided by the invention has great advantages in the number of units and the size, so compared with JSSC'21, the energy consumption of the bistable physical unclonable function circuit provided by the invention is reduced by 1.7 times; in the aspect of uniqueness, within the confidence interval of 95%, the bistable physical unclonable function circuit provided by the invention is still 1.09 times better than the PUF circuit provided in JSSC'16; and in the aspect of reliability, the error rate of the bistable physical unclonable function circuit provided by the invention is 1.44 times lower than that of the PUF circuit in ISSC'17.

To sum up, the invention constructs a bistable physical unclonable function circuit by introducing bistable PUFs and a subthreshold current deviation sensitivity mechanism. By comparing the subthreshold leakage current deviation of two NMOS transistors in each PUF unit, the bistable physical unclonable function circuit obtains a compact PUF array structure under the precondition of good randomness, uniqueness and reliability by means of shared bistable multiplexing. Test results indicate that the PUF array can generate 256 bits of responses within one work cycle, and under the working condition of 1.2V/5.6 MHz, the energy consumption is about 8.976 fJ/bit, the randomness reaches 52.6%, and the layout area of each PUF unit is 0.177 $\mu m^2$. It thus can be seen that the bistable physical unclonable function circuit provided by the invention has lower hardware resource consumption and high-quantity output responses, and provides a new solution to security key generation and storage of low-power hardware security chip systems.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A bistable physical unclonable function circuit based on subthreshold leakage current deviation, comprising: a time sequence control circuit, a decoder, 16 bias voltage converters and a PUF array, wherein the time sequence control circuit is controlled by an external clock signal to generate and output a precharge signal and an enable signal; the precharge signal and the enable signal are input to the decoder, the decoder is controlled by the precharge signal and the enable signal to convert an external stimulus signal ADDR<0:3> into 16 decoded signals and output the decoded signals, the external stimulus signal ADDR<0:3> is a four-bit binary number, a first bit of the external stimulus signal ADDR<0:3> is ADDR<0>, a second bit of the external stimulus signal ADDR<0:3> is ADDR<1>, a third bit of the external stimulus signal ADDR<0:3> is ADDR<2>, and a fourth bit of the external stimulus signal ADDR<0:3> is ADDR<3>; the $k^{th}$ decoded signal is input to the $k^{th}$ bias voltage converter and is converted by the $k^{th}$ bias voltage converter into a $k^{th}$ word line signal which is input to the PUF array, wherein k=1, 2, . . . , 16; the PUF array is controlled by the precharge signal and the word line signals output by the 16 bias voltage converters to generate response signals and output the response signals in series; the PUF array comprises a first PMOS transistor, a second PMOS transistor, a third PMOS transistor, a fourth PMOS transistor, a first NMOS transistor, a second NMOS transistor, a third NMOS transistor, a fourth NMOS transistor, a first two-input NAND gate, a second two-input NAND gate and 16 PUF units; each PUF unit has a first input terminal, a second input terminal, a first output terminal, a second output terminal and a control terminal, the first two-input NAND gate and the second two-input NAND gate each have a first input terminal, a second input terminal and an output terminal, and a width-to-length ratio of the first PMOS transistor and the second PMOS transistor is 2 $\mu m$/60 nm; an external supply voltage is accessed to a source of the first PMOS transistor and a source of the second PMOS transistor, and a value of the external supply voltage is between 1.0V-1.4V; a gate of the first PMOS transistor and a gate of the second PMOS transistor are connected, a connecting terminal between the gate of the first PMOS transistor and the gate of the second PMOS transistor is a control terminal of the PUF array, and the precharge signal is input to the control terminal of the PUF array; a drain of the first PMOS transistor is connected to a source of the third PMOS transistor; a drain of the second PMOS transistor is connected to a source of the fourth PMOS transistor; a gate of the third PMOS transistor, a drain of the fourth PMOS transistor and a gate of the first NMOS transistor are connected to the second input terminal of a first PUF unit of the PUF units; a gate of the fourth PMOS transistor, a drain of the third PMOS transistor and a gate of the second NMOS transistor are connected to the first input terminal of the first PUF unit; the first output terminal of a $j^{th}$ PUF unit of the PUF units is connected to the first input terminal of a $(j+1)^{th}$ PUF unit of the PUF units, the second output terminal of the $j^{th}$ PUF unit is connected to the second input terminal of the $(j+1)^{th}$ PUF unit, and j=1, 2, . . . , 15; the first output terminal of a sixteenth PUF unit of the PUF units is connected to a drain of the first NMOS transistor, and the second output terminal of the sixteenth PUF unit is connected to a drain of the second NMOS transistor; the control terminal of a $k^{th}$ PUF unit of the PUF units is taken as a $k^{th}$ control terminal of the PUF array, and the $k^{th}$ word line signal output by the $k^{th}$ bias voltage converter is input to the $k^{th}$ control terminal of the PUF array; a source of the first NMOS transistor is connected to a drain of the third NMOS transistor; a source of the second NMOS transistor is connected to a drain of the fourth NMOS transistor; a gate of the third NMOS transistor is connected to a gate of the fourth NMOS transistor; a source of the third NMOS transistor is connected to the first input terminal of the first two-input NAND gate; a source of the fourth NMOS transistor is connected to the first input terminal of the second two-input NAND gate; the second input terminal of the first two-input NAND gate is connected to the output terminal of the second two-input NAND gate; the second input terminal of the second two-input NAND gate is connected to the output terminal of the first two-input NAND gate, and a connecting terminal between the second input terminal of the second two-input NAND gate and the output terminal of the first two-input NAND gate is taken as an output terminal of the PUF array and is used for outputting the response signals; each bias voltage converter comprises a twelfth PMOS transistor and a fourteenth NMOS transistor, wherein a gate of the twelfth PMOS transistor and a gate of the fourteenth NMOS transistor are connected, a connecting terminal between the gate of the twelfth PMOS transistor and the gate of the fourteenth NMOS transistor is taken as an input terminal of the each bias voltage converter, wherein a decoded signal outputted by the decoder is input into the input terminal of the each bias voltage converter; a drain of the twelfth PMOS transistor and a drain of the fourteenth NMOS transistor are connected, and a connecting terminal between the drain of the twelfth PMOS transistor and the drain of the fourteenth NMOS transistor is taken as an output terminal of the each bias voltage converter, wherein the output terminal of the each bias voltage converter is used for outputting the word line signal; the external supply voltage is input to a source of the twelfth PMOS transistor; an external bias voltage is input to a source of the fourteenth NMOS transistor, and a value of the external bias voltage is between 300 mV-425 mV; under the control of the decoded signal input to the input terminal of the each bias voltage converter, the output terminal of the each bias voltage converter outputs the external supply voltage or the external bias voltage; when the decoded signal input to the input terminal of the each bias voltage converter is a high level, the twelfth PMOS transistor is turned off, the fourteenth NMOS transistor is turned on, and the output terminal of the each bias voltage converter outputs the external bias voltage; when the decoded signal input to the input terminal of the each bias voltage converter is a low level, the twelfth PMOS transistor is turned on, the fourteenth NMOS transistor is turned off, and the output terminal of the each bias voltage converter outputs the external supply voltage; each PUF unit comprises a fifth NMOS transistor and a sixth NMOS transistor, wherein a drain of the fifth NMOS transistor is taken as the first input terminal of the each PUF unit, a source of the fifth NMOS transistor is taken as the first output terminal of the each PUF unit, a source of the sixth NMOS transistor is taken as the second output terminal of the each PUF unit, a gate of the fifth NMOS transistor and a gate of the sixth NMOS transistor are connected, and a connecting terminal between the gate of the fifth NMOS transistor and the gate of the sixth NMOS transistor is taken as the control terminal of the each PUF unit; the first PMOS transistor and the second PMOS transistor form a P-type sharing terminal used for isolating the 16 PUF units from the external supply voltage; the third PMOS transistor, the fourth PMOS transistor, the first NMOS transistor and the second NMOS transistor form a cross-coupled bistable structure; in each PUF unit, the fifth NMOS transistor and the sixth NMOS transistor are taken as gating switch tubes, a current across the fifth NMOS transistor is denoted as I1, a current across the sixth NMOS transistor is denoted as I2, and I1 and I2 are used as bias current sources; when the bistable physical unclonable function circuit works, the external clock signal is input to the time sequence control circuit, the time sequence control circuit in turn generates and outputs the precharge signal and the enable signal; after receiving the precharge signal and the enable signal, the decoder decodes the external stimulus signal ADDR<0:3> to generate and output 16 decoded signals, the 16 bias voltage converters process the 16 decoded signals correspondingly to obtain and output corresponding word line signals, and the word line signal output by each bias voltage converter is either the external supply voltage or the external bias voltage; when the word line signal output by one bias voltage converter is the external bias voltage, the fifth NMOS transistor and the sixth NMOS transistor in the PUF unit connected to the one bias voltage converter work in a subthreshold region; 16 word line signals are correspondingly input to the 16 PUF units, a working state of each PUF unit is divided into a precharge phase and an evaluation phase, and under the control of the precharge signal and the 16 word line signals, the 16 PUF units enter the working state sequentially from the first PUF unit to the sixteenth PUF unit; first, a decoded signal WL<0>, which is the external bias voltage, is input to the first PUF unit, decoded signals, which are all the external supply voltage, are input the other fifteen PUF units which are completely turned on, the precharge signal is a low level, the first PUF unit enters the precharge phase, a connection node of the gate of the second NMOS transistor, the drain of the third PMOS transistor, the gate of the fourth PMOS transistor and the first output terminal of the first PUF unit is denoted as Q, a connection node of the gate of the third PMOS transistor, the drain of the fourth PMOS transistor, the gate of the first NMOS transistor and the second output terminal of the first PUF unit is denoted as QB, Q and QB are charged to the external supply voltage, then the precharge signal turns into a high level, the first PUF unit enters the evaluation phase, Q and QB start to discharge through the first PUF unit, and because of a current deviation between the current I1 across the fifth NMOS transistor and the current I2 across the sixth NMOS transistor in the first PUF unit, the P-type sharing terminal and the cross-coupled bistable structure, voltages of the fifth NMOS transistor and the sixth NMOS transistor in the first PUF unit is quickly amplified, and a stable output response is established quickly; if I1>I2, a voltage at QB is the external supply voltage, and a voltage at Q is 0; if I1<I2, the voltage at QB is 0, and the voltage at Q is the external supply voltage; at this moment, an RS flip-latch formed by the first two-input NAND gate and the second two-input NAND gate outputs a first response signal, and the bistable physical unclonable function circuit completes the output of the first response signal; next, a decoded signal WL<1>, which is the external bias voltage, is input to a second PUF unit of the PUF units, decoded signals, which are all the external supply voltage, are input to the other fifteen PUF units which are completely turned on, the precharge signal is a low level, the second PUF unit enters the precharge phase and works in a same way as the first PUF unit until the bistable physical unclonable function circuit outputs a second response signal; the process is repeated unit the sixteenth PUF unit finishes working, and at this moment, one work cycle of the PUF array is completed; and then, a next work cycle is started under the control of the precharge signal, and the process is repeated until the bistable physical unclonable function circuit stops working.

2. The bistable physical unclonable function circuit based on subthreshold leakage current deviation according to claim 1, wherein the time sequence control circuit comprises a fifth PMOS transistor, a sixth PMOS transistor, a seventh PMOS transistor, an eighth PMOS transistor, a ninth PMOS transistor, a seventh NMOS transistor, an eighth NMOS transistor, a ninth NMOS transistor, a tenth NMOS transistor, an eleventh NMOS transistor, a first two-input AND gate, a first inverter, a second inverter, a third two-input NAND gate and 25 buffers, wherein the first two-input AND gate and the third two-input NAND gate each have a first input terminal, a second input terminal and an output terminal; the external supply voltage is accessed to the source of the first PMOS transistor, a source of the seventh PMOS transistor and a source of the eighth PMOS transistor; a gate of the fifth PMOS transistor is connected to a gate of the eighth NMOS transistor; a drain of the fifth PMOS transistor is connected to a source of the sixth PMOS transistor; a drain of the sixth PMOS transistor, a drain of the seventh NMOS transistor, a gate of the seventh PMOS transistor, a gate of the ninth NMOS transistor, a drain of the ninth PMOS transistor and a drain of the tenth NMOS transistor are connected; a source of the seventh NMOS transistor is connected to a drain of the eighth NMOS transistor; a source of the eighth NMOS transistor is grounded; a gate of the sixth PMOS transistor and a gate of the tenth NMOS transistor are connected to the first input terminal of the first two-input AND gate, and a connecting terminal between the gate of the sixth PMOS transistor, the gate of the tenth NMOS transistor and the first input terminal of the first two-input AND gate is a clock terminal of the time sequence control circuit, and the external clock signal is input to the clock terminal of the time sequence control circuit; a gate of the seventh NMOS transistor is connected to a gate of the ninth PMOS transistor; a gate of the seventh PMOS transistor, a drain of the ninth NMOS transistor, a gate of the eighth PMOS transistor and a gate of the eleventh NMOS transistor are connected to the second input terminal of the first two-input AND gate; a source of the ninth NMOS transistor and a source of the eleventh NMOS transistor are grounded; a drain of the eighth PMOS transistor is connected to a source of the ninth PMOS transistor; a source of the tenth NMOS transistor is connected to a drain of the eleventh NMOS transistor; the output terminal of the first two-input AND gate, an output terminal of a first buffer of the buffers and the first input terminal of the third two-input NAND gate are connected, a connecting terminal between the output terminal of the first two-input AND gate, the output terminal of the first buffer and the first input terminal of the third two-input NAND gate is an enable output terminal of the time sequence control circuit, and the enable output terminal of the time sequence control circuit is used for outputting the enable signal; an output terminal of a $m^{th}$ buffer of the buffers is connected to an input terminal of a $(m+1)^{th}$ buffer of the buffers, and m=1, 2, ..., 24; an output terminal of a twenty-fifth buffer of the buffers is connected to an input terminal of the first inverter, an output terminal of the first inverter is connected to the second input terminal of the third two-input NAND gate, the output terminal of the third two-input NAND gate is connected to an input terminal of the second inverter, an output terminal of the second inverter is a control output terminal of the time sequence control circuit, and the control output terminal of the time sequence control circuit is used for outputting the precharge signal.

3. The bistable physical unclonable function circuit based on subthreshold leakage current deviation according to claim 2, wherein each buffer comprises a tenth PMOS transistor, an eleventh PMOS transistor, a twelfth NMOS transistor and a thirteenth NMOS transistor, wherein the external supply voltage is accessed to a source of the tenth PMOS transistor and a source of the eleventh PMOS transistor; a gate of the tenth PMOS transistor and a gate of the twelfth NMOS transistor are connected, and a connecting terminal between the gate of the tenth PMOS transistor and the gate of the twelfth NMOS transistor is an input terminal of the each buffer; a drain of the tenth PMOS transistor, a drain of the twelfth NMOS transistor, a gate of the eleventh PMOS transistor and a gate of the thirteenth NMOS transistor are connected; a drain of the eleventh PMOS transistor and a drain of the thirteenth NMOS transistor are connected, and a connecting terminal between the drain of the eleventh PMOS transistor and the drain of the thirteenth NMOS transistor is an output terminal of the each buffer; and a source of the twelfth NMOS transistor and a source of the thirteenth NMOS transistor are grounded.

4. The bistable physical unclonable function circuit based on subthreshold leakage current deviation according to claim 1, wherein the decoder comprises a first flip-latch, a second flip-latch, a third flip-latch, a fourth flip-latch, a second two-input AND gate, a third two-input AND gate, a fourth two-input AND gate, a fifth two-input AND gate, a sixth two-input AND gate, a seventh two-input AND gate, an eighth two-input AND gate, a ninth two-input AND gate and 16 stages of three-input AND gate, wherein the first flip-latch, the second flip-latch, the third flip-latch and the fourth flip-latch each have an input terminal, an enable terminal, an output terminal and an inverse output terminal; the second two-input AND gate, the third two-input AND gate, the fourth two-input AND gate, the fifth two-input AND gate, the sixth two-input AND gate, the seventh two-input AND gate, the eighth two-input AND gate and the ninth two-input AND gate each have a first input terminal, a second input terminal and an output terminal; and each stage of three-input AND gate has a first input terminal, a second input terminal, a third input terminal and an output terminal; the enable terminal of the first flip-latch, the enable terminal of the second flip-latch, the enable terminal of the third flip-latch and the enable terminal of the fourth flip-latch are connected, a connecting terminal between the enable terminal of the first flip-latch, the enable terminal of the second flip-latch, the enable terminal of the third flip-latch and the enable terminal of the fourth flip-latch is an enable terminal of the decoder, and the enable signal is input to the enable terminal of the decoder; ADDR<0> is input to the input terminal of the first flip-latch, ADDR<1> is input to the input terminal of the second flip-latch, ADDR<2> is input to the input terminal of the third flip-latch, ADDR<3> is input to the input terminal of the fourth flip-latch, the output terminal of the first flip-latch outputs a first latch signal, the inverse output terminal of the first flip-latch outputs a first inverse signal, the output terminal of the second flip-latch outputs a second latch signal, the inverse output terminal of the second flip-latch outputs a second inverse signal, the output terminal of the third flip-latch outputs a third latch signal, the inverse output terminal of the third flip-latch outputs a third inverse signal, the output terminal of the fourth flip-latch outputs a fourth latch signal, and the inverse output terminal of the fourth flip-latch outputs a fourth inverse signal; the output terminal of the first flip-latch is connected to the first input terminal of the second two-input AND gate and the first input terminal of the fourth two-input AND gate, the inverse output terminal of the first flip-latch is to the second input terminal of the third two-input AND gate and the first input terminal of the fifth two-input AND gate, the output terminal of the second flip-latch is connected to the second input terminal of the second two-input AND gate and the first input terminal of the third two-input AND gate, the inverse output terminal of the second flip-latch is connected to the second input terminal of the fourth two-input AND gate and the second input terminal of the fifth two-input AND gate, the output terminal of the third flip-latch is connected to the first input terminal of the sixth two-input AND gate and the first input terminal of the eighth two-input AND gate, the inverse output terminal of the third flip-latch is connected to the second input terminal of the seventh two-input AND gate and the first input terminal of the ninth two-input AND gate, the output terminal of the fourth flip-latch is connected to the second input terminal of the sixth two-input AND gate and the first input terminal of the seventh two-input AND gate, the inverse output terminal of the fourth flip-latch is connected to the second input terminal of the eighth two-input AND gate and the second input terminal of the ninth two-input AND gate, the output terminal of the second two-input AND gate is connected to the first input terminal of a first stage of the 16 stages of three-input AND gate, the first input terminal of a second stage of the 16 stages of three-input AND gate, the first input terminal of a third stage of the 16 stages of three-input AND gate and the first input terminal of a fourth stage of the 16 stages of three-input AND gate, the output terminal of the second two-input AND gate outputs binary data X<0>, the output terminal of the third two-input AND gate is connected to the first input terminal of a fifth stage of the 16 stages of three-input AND gate, the first input terminal of a sixth stage of the 16 stages of three-input AND gate, the first input terminal of a seventh stage of the 16 stages of three-input AND gate and the first input terminal of a eighth stage of the 16 stages of three-input AND gate, the output terminal of the third two-input AND gate outputs binary data X<1>, the output terminal of the fourth two-input AND gate is connected to the first input terminal of a ninth stage of the 16 stages of three-input AND gate, the first input terminal of a tenth stage of the 16 stages of three-input AND gate, the first input terminal of an eleventh stage of the 16 stages of three-input AND gate and the first input terminal of a twelfth stage of the 16 stages of three-input AND gate, the output terminal of the fourth two-input AND gate outputs binary data X<2>, the output terminal of the fifth two-input AND gate is connected to the first input terminal of a thirteenth stage of the 16 stages of three-input AND gate, the first input terminal of a fourteenth stage of the 16 stages of three-input AND gate, the first input terminal of a fifteenth stage of the 16 stages of three-input AND gate and the first input terminal of a sixteenth stage of the 16 stages of three-input AND gate, the output terminal of the fifth two-input AND gate outputs binary data X<3>, the output terminal of the sixth two-input AND gate is connected to the second input terminal of the first stage of three-input AND gate, the second input terminal of the fifth stage of three-input AND gate, the second input terminal of the ninth stage of three-input AND gate and the second input terminal of the thirteenth stage of three-input AND gate, the output terminal of the sixth two-input AND gate outputs binary data Y<0>, the output terminal of the seventh two-input AND gate is connected to the second input terminal of the second stage of three-input AND gate, the second input terminal of the sixth stage of three-input AND gate, the second input terminal of the tenth stage of three-input AND gate and the second input terminal of the fourteenth stage of three-input AND gate, the output terminal of the seventh two-input AND gate outputs binary data Y<1>, the output terminal of the eighth two-input AND gate is connected to the second input terminal of the third stage of three-input AND gate, the second input terminal of the seventh stage of three-input AND gate, the second input terminal of the eleventh stage of three-input AND gate and the second input terminal of the fifteenth stage of three-input AND gate, the output terminal of the eighth two-input AND gate outputs binary data Y<2>, the output terminal of the ninth two-input AND gate is connected to the second input terminal of the fourth stage of three-input AND gate, the second input terminal of the eighth stage of three-input AND gate, the second input terminal of the twelfth stage of three-input AND gate and the second input terminal of the sixteenth stage of three-input AND gate, the output terminal of the ninth two-input AND gate outputs binary data Y<3>, the third input terminals of the 16 stages of three-input AND gates are connected, a connecting terminal between the third input terminals of the 16 stages of three-input AND gates is a control terminal of the decoder, the precharge signal is input to the control terminal of the decoder, the output terminal of a $k^{th}$ stage of the 16 stages of t three-input AND gate is connected to the $k^{th}$ bias voltage converter, and the output terminal of the $k^{th}$ stage of three-input AND gate outputs the $k^{th}$ decoded signal.

* * * * *